US012721135B2

(12) United States Patent
Kang et al.

(10) Patent No.: US 12,721,135 B2
(45) Date of Patent: Aug. 25, 2026

(54) INTEGRATED CIRCUIT DEVICE

(71) Applicant: Samsung Electronics Co., Ltd., Suwon-si (KR)

(72) Inventors: Sangkoo Kang, Suwon-si (KR); Wookyung You, Suwon-si (KR); Minjae Kang, Suwon-si (KR); Koungmin Ryu, Suwon-si (KR); Hoonseok Seo, Suwon-si (KR); Woojin Lee, Suwon-si (KR); Junchae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 572 days.

(21) Appl. No.: 18/320,423

(22) Filed: May 19, 2023

(65) Prior Publication Data

US 2024/0136254 A1 Apr. 25, 2024
US 2024/0234250 A9 Jul. 11, 2024

(30) Foreign Application Priority Data

Oct. 21, 2022 (KR) ........................ 10-2022-0136846

(51) Int. Cl.

*H01L 23/48* (2006.01)
*H10D 84/83* (2025.01)
*H10W 10/00* (2026.01)
*H10W 10/17* (2026.01)
*H10W 20/00* (2026.01)
(Continued)

(52) U.S. Cl.

CPC ............ *H10W 20/20* (2026.01); *H10D 84/83* (2025.01); *H10W 10/014* (2026.01);
(Continued)

(58) Field of Classification Search

CPC ............. H01L 23/481; H01L 21/76224; H01L 21/76898; H10D 84/83; H10D 30/014;
(Continued)

(56) References Cited

U.S. PATENT DOCUMENTS 10,586,765 B2 3/2020 Smith et al.
10,872,859 B2 12/2020 Kim et al.
(Continued)

FOREIGN PATENT DOCUMENTS

CN 111968969 A 11/2020

OTHER PUBLICATIONS

Extended European Search Report dated Apr. 2, 2024 issued in European Patent Application No. 23187370.4-1211.
(Continued)

*Primary Examiner* — Victor A Mandala
*Assistant Examiner* — Colleen E Snow
(74) *Attorney, Agent, or Firm* — Harness, Dickey & Pierce, P.L.C.

(57) ABSTRACT

An integrated circuit (IC) device includes a substrate, a pair of fin-type active regions protruding from the substrate to define a trench region on the substrate, the fin-type active regions extending in a first lateral direction, a pair of source/drain regions on the fin-type active regions, respectively, a device isolation film in the trench region, the device isolation film apart from the substrate in a vertical direction, an etch stop structure filling at least a portion of the trench region between the substrate and the device isolation film, a via power rail between the pair of fin-type active regions and between the pair of source/drain regions, the via power rail passing through at least a portion of the etch stop structure, and a backside power rail passing through the substrate, the backside power rail in contact with one end of the via power rail.

20 Claims, 34 Drawing Sheets

(51) Int. Cl.
*H10W 20/20* (2026.01)
*H10D 30/01* (2025.01)

(52) U.S. Cl.
CPC ......... *H10W 10/17* (2026.01); *H10W 20/023* (2026.01); *H10D 30/014* (2025.01); *H10D 30/031* (2025.01)

(58) Field of Classification Search
CPC .. H10D 30/031; H10W 20/20; H10W 10/014; H10W 10/17; H10W 20/023
See application file for complete search history.

(56) References Cited

U.S. PATENT DOCUMENTS

| | | | | |
|---|---|---|---|---|
| 10,978,351 | B2 | 4/2021 | Wen et al. | |
| 11,121,086 | B2 | 9/2021 | Hiblot et al. | |
| 11,227,922 | B2 | 1/2022 | Li et al. | |
| 2012/0205777 | A1 | 8/2012 | Lee | |
| 2021/0028112 | A1 | 1/2021 | Kim et al. | |
| 2021/0384351 | A1 | 12/2021 | Chen et al. | |
| 2022/0028895 | A1 | 1/2022 | Kim et al. | |
| 2022/0122970 | A1 | 4/2022 | Do et al. | |
| 2022/0139900 | A1 | 5/2022 | Oh et al. | |
| 2022/0173039 | A1 | 6/2022 | Yang et al. | |
| 2022/0181198 | A1 | 6/2022 | Licausi et al. | |
| 2022/0285512 | A1* | 9/2022 | Cheng | H10D 62/121 |

OTHER PUBLICATIONS

Taiwanese Office Action dated Jan. 13, 2026 issued in Taiwanese Patent Application No. 112130520.

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0136846, filed on Oct. 21, 2022, in the Korean Intellectual Property Office, the disclosure of which is incorporated by reference herein in its entirety.

BACKGROUND

Various example embodiments relate to an integrated circuit (IC) device, and more particularly, to an IC device including a power rail.

As electronic products are required or desired to be miniaturized, multifunctional, and highly efficient, integrated circuit (IC) devices are also required or desired to become larger in capacity and highly integrated. Accordingly, it is necessary or desirable to more efficiently design wiring structures to achieve higher integration while ensuring or at least helping to ensure function and operating speed expected of the IC devices.

SUMMARY

Various example embodiments provide an integrated circuit (IC) device having improved integration density and/or reliability.

According to some example embodiments, there is provided an IC device including a substrate having a back side surface, a pair of fin-type active regions protruding from the substrate to define a trench region on the substrate on an opposite side of the back side surface, the pair of fin-type active regions extending in a first lateral direction, a pair of source/drain regions on the pair of fin-type active regions, respectively, a device isolation film covering at least a portion of a sidewall of each of the pair of fin-type active regions in the trench region, the device isolation film apart from the substrate in a vertical direction, an etch stop structure filling at least a portion of the trench region between the substrate and the device isolation film, a via power rail between the pair of fin-type active regions and between the pair of source/drain regions, the via power rail passing through at least a portion of the etch stop structure in the vertical direction, and a backside power rail passing through the substrate from the back side surface of the substrate in the vertical direction, the backside power rail in contact with one end of the via power rail.

Alternatively or additionally according to some example embodiments, there is provided an IC device including a substrate having a back side surface, a plurality of fin-type active regions protruding from the substrate to define a plurality of trench regions in the substrate on an opposite side of the back side surface, the plurality of fin-type active regions extending in a first lateral direction, a plurality of source/drain regions on the plurality of fin-type active regions, respectively, a device isolation film covering at least a portion of a sidewall of each of the plurality of fin-type active regions in the plurality of trench regions, the device isolation film apart from the substrate in a vertical direction, a plurality of etch stop structures between the substrate and the device isolation film at bottoms of the plurality of trench regions, respectively, a via power rail apart from the plurality of fin-type active regions and the plurality of source/drain regions in a lateral direction, the via power rail passing through at least a portion of one etch stop structure selected from the plurality of etch stop structures in the vertical direction, and a backside power rail passing from the back side surface of the substrate through the substrate in the vertical direction and passing through another portion of the one selected etch stop structure in the vertical direction, the backside power rail in contact with one end of the via power rail.

Alternatively or additionally according to some example embodiments, there is provided an IC device including a substrate having a back side surface, a fin-type active region protruding from the substrate to define a portion of a trench region in the substrate on an opposite side of the back side surface, at least one nanosheet on the fin-type active region, the at least one nanosheet apart from a fin top surface of the fin-type active region in a vertical direction, a gate line surrounding the at least one nanosheet on the fin-type active region, the gate line extending long in a second lateral direction, the second lateral direction intersecting the first lateral direction, a source/drain region adjacent to the gate line on the fin-type active region, the source/drain region in contact with the at least one nanosheet, a device isolation film covering at least a portion of a sidewall of the fin-type active region in the trench region, the device isolation film apart from the substrate in the vertical direction, an etch stop structure including an insulating liner and an insulating stopper, the insulating liner filling a portion of the trench region between the substrate and the device isolation film, the insulating liner in contact with each of the sidewall of the fin-type active region and the substrate, and the insulating stopper between the insulating liner and the device isolation film, a via power rail apart from each of the fin-type active region, the source/drain region, and the gate line in the second lateral direction, the via power rail passing through the gate line in the vertical direction and passing through at least a portion of the etch stop structure, and a backside power rail passing from the back side surface of the substrate through the substrate in the vertical direction and contacting one end of the via power rail.

BRIEF DESCRIPTION OF THE DRAWINGS

Various example embodiments of the inventive concept will be more clearly understood from the following detailed description taken in conjunction with the accompanying drawings in which:

FIGS. 8 to 21C are cross-sectional views of a process sequence of a method of manufacturing an IC device, according to some example embodiments, wherein FIGS. 8 to 12, 13B, 14, 15B, 19B, 20B, and 21B are cross-sectional views of example cross-sectional structures of a portion corresponding to a cross-section taken along line Y1-Y1' of FIG. 2, according to a process sequence, FIGS. 13A, 15A, 16, 17, 18, 19A, 20A, and 21A are cross-sectional views of example cross-sectional structures of a portion corresponding to a cross-section taken along line X1-X1' of FIG. 2, according to a process sequence, and FIGS. 13C, 15C, 19C, 20C, and 21C are cross-sectional views of example cross-sectional structures of a portion corresponding to a cross-section taken along line Y2-Y2' of FIG. 2, according to a process sequence.

DETAILED DESCRIPTION OF VARIOUS EXAMPLE EMBODIMENTS

Figure 1:
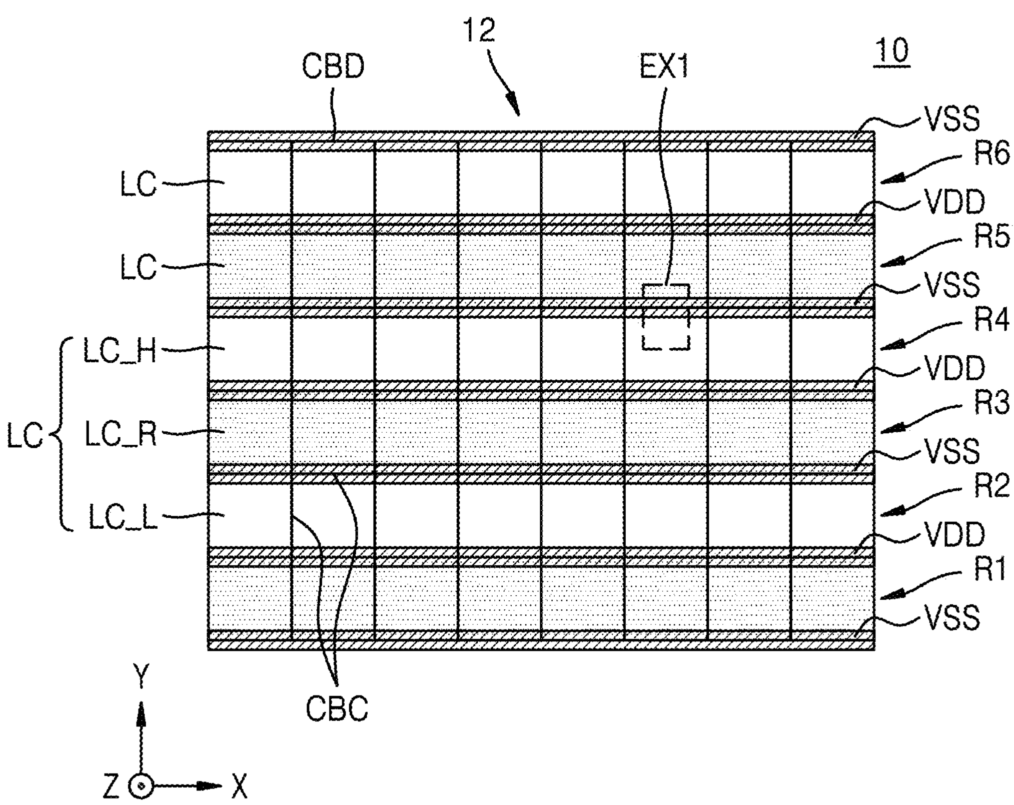
FIG. 1 is a plan layout diagram of a cell block of an integrated circuit (IC) device according to some example embodiments.

Hereinafter, some example embodiments will be described in detail with reference to the accompanying drawings. The same reference numerals are used to denote the same elements in the drawings, and repeated descriptions thereof are omitted.

FIG. 1 is a plan layout diagram of a cell block 12 of an integrated circuit (IC) device 10, according to some example embodiments.

Referring to FIG. 1, the cell block 12 of the IC device 10 may include a plurality of logic cells LC, which include circuit patterns configured to constitute various circuits. The plurality of logic cells LC may be arranged in a matrix form in a widthwise direction (X direction) and a height direction (Y direction) in the cell block 12.

Each of the plurality of logic cells LC may include a circuit pattern having a layout designed, for example, according to a place-and-route (PnR) technique to perform at least one logic function. The plurality of logic cells LC may perform various logic functions. In some example embodiments, the plurality of logic cells LC may include a plurality of standard cells. In some example embodiments, at least some of the plurality of logic cells LC may perform the same logic function. Alternatively or additionally in some example embodiments, at least some of the plurality of logic cells LC may perform different logic functions.

The plurality of logic cells LC may include various kinds of logic cells including a plurality of circuit elements. For example, each of the plurality of logic cells LC may include one or more various gates, such as one or more of an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, a latch, or a combination thereof, without being limited thereto.

In the cell block 12, at least some of the plurality of logic cells LC that forms one row R1, R2, R3, R4, R5, or R6 in the widthwise direction (X direction) may have the same width as each other. Also, at least some of the plurality of logic cells LC that forms one row R1, R2, R3, R4, R5, or R6 may have the same height as each other. However, example embodiments are not limited to those illustrated in FIG. 1, and at least some of the plurality of logic cells LC that forms one row R1, R2, R3, R4, R5, or R6 may have different widths and/or different heights from each other.

An area of each of the plurality of logic cells LC included in the cell block 12 of the IC device 10 may be defined by a cell boundary CBD. A cell boundary contact portion CBC where respective cell boundaries CBD of two logic cells LC that are adjacent to each other in the widthwise direction (X direction) or the height direction (Y direction), from among the plurality of logic cells LC, meet each other may be between the two adjacent logic cells LC.

In some example embodiments, from among the plurality of logic cells LC that form one row R1, R2, R3, R4, R5, or R6, two logic cells LC that are adjacent to each other in the widthwise direction may contact each other or be adjacent to each other at the cell boundary contact portion CBC without a distance therebetween. Alternatively or additionally, from among the plurality of logic cells LC that form one row R1, R2, R3, R4, R5, or R6, two logic cells LC that are adjacent to each other in the widthwise direction may be a distance (such as a dynamically determined or predetermined distance) apart from each other.

In some example embodiments, from among the plurality of logic cells LC that form one row R1, R2, R3, R4, R5, or R6, two adjacent logic cells may perform the same function as each other. In this case, the two adjacent logic cells LC may have the same structure as each other. In some example embodiments, from among the plurality of logic cells LC that form one row R1, R2, R3, R4, R5, or R6, two adjacent logic cells may perform different functions or at least one different function from each other.

In some example embodiments, one logic cell LC, which is selected from the plurality of logic cells LC included in the cell block 12 of the IC device 10, may have a symmetrical structure to another logic cell LC, which is adjacent to the selected logic cell LC in the height direction (Y direction in FIG. 1), about the cell boundary contact portion CBC therebetween. For example, a reference logic cell LC_R in a third row R3 may have a symmetrical structure to a lower logic cell LC_L in a second row R2 about the cell boundary contact portion CBC therebetween. Also, the reference logic cell LC_R in the third row R3 may have a symmetrical structure to an upper logic cell LC_H in a fourth row R2 about the cell boundary contact portion CBC therebetween.

Although FIG. 1 illustrates an example in which the cell block 12 including six rows R1, R2, . . . , and R6, example embodiments are not limited thereto. The cell block 12 may include various numbers of rows, which are selected as needed or desired or specified, and one row may include various numbers of logic cells, which are selected as needed or desired or specified.

A selected one of a plurality of ground lines VSS and a plurality of power lines VDD may be between a plurality of rows (e.g., R1, R2, R3, R4, R5, and R6), each of which includes a plurality of logic cells LC arranged in a line in the widthwise direction (X direction). The plurality of ground lines VSS and the plurality of power lines VDD may each extend in a first lateral direction (X direction) and may be alternately arranged apart from each other in a second lateral direction (Y direction). Accordingly, the plurality of ground lines VSS and the plurality of power lines VDD may each overlap the cell boundary CBD of the logic cell LC in the second lateral direction (Y direction).

Figure 2:
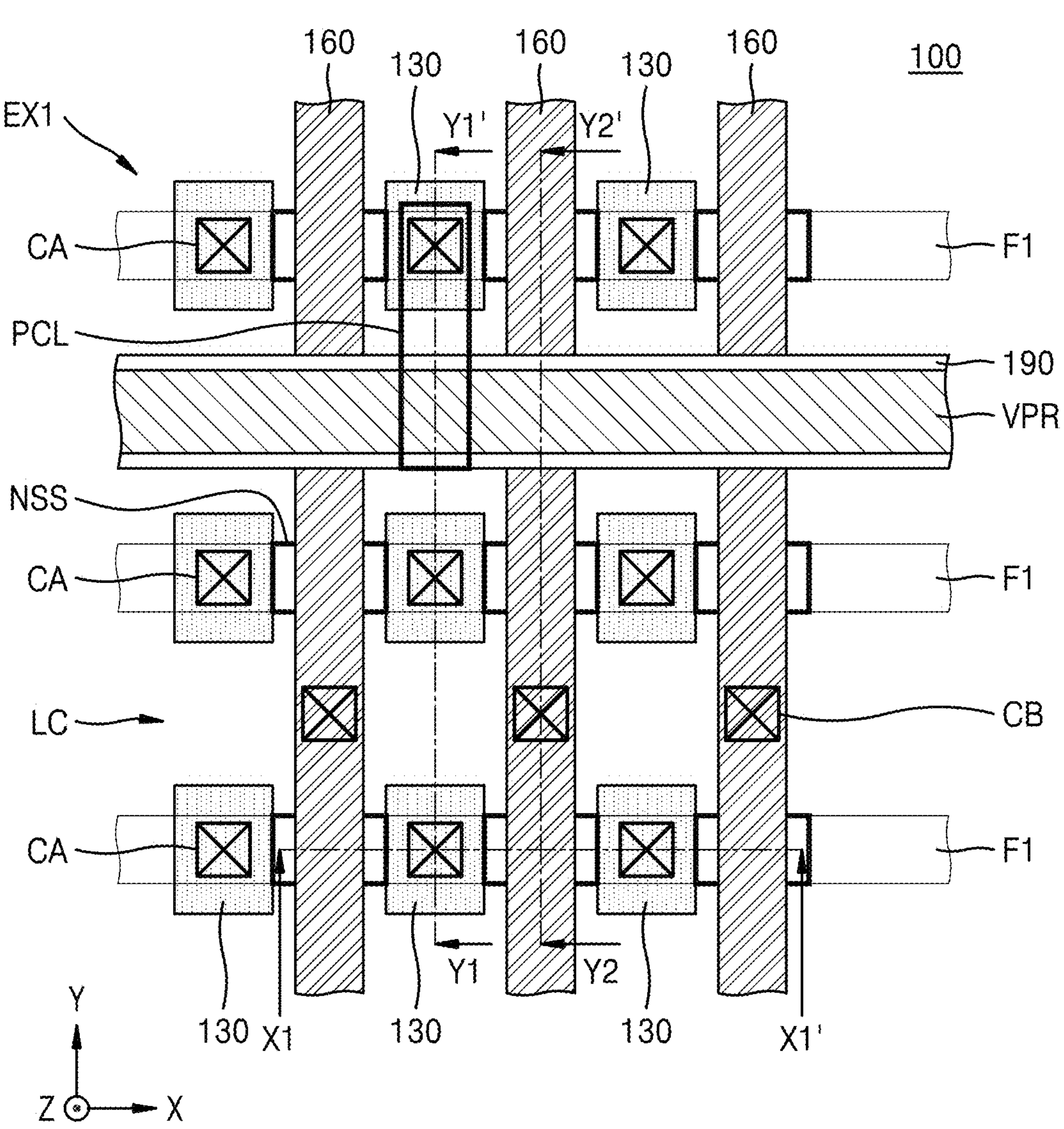
FIG. 2 is a plan layout diagram of an IC device according to some example embodiments.
Figure 3A:
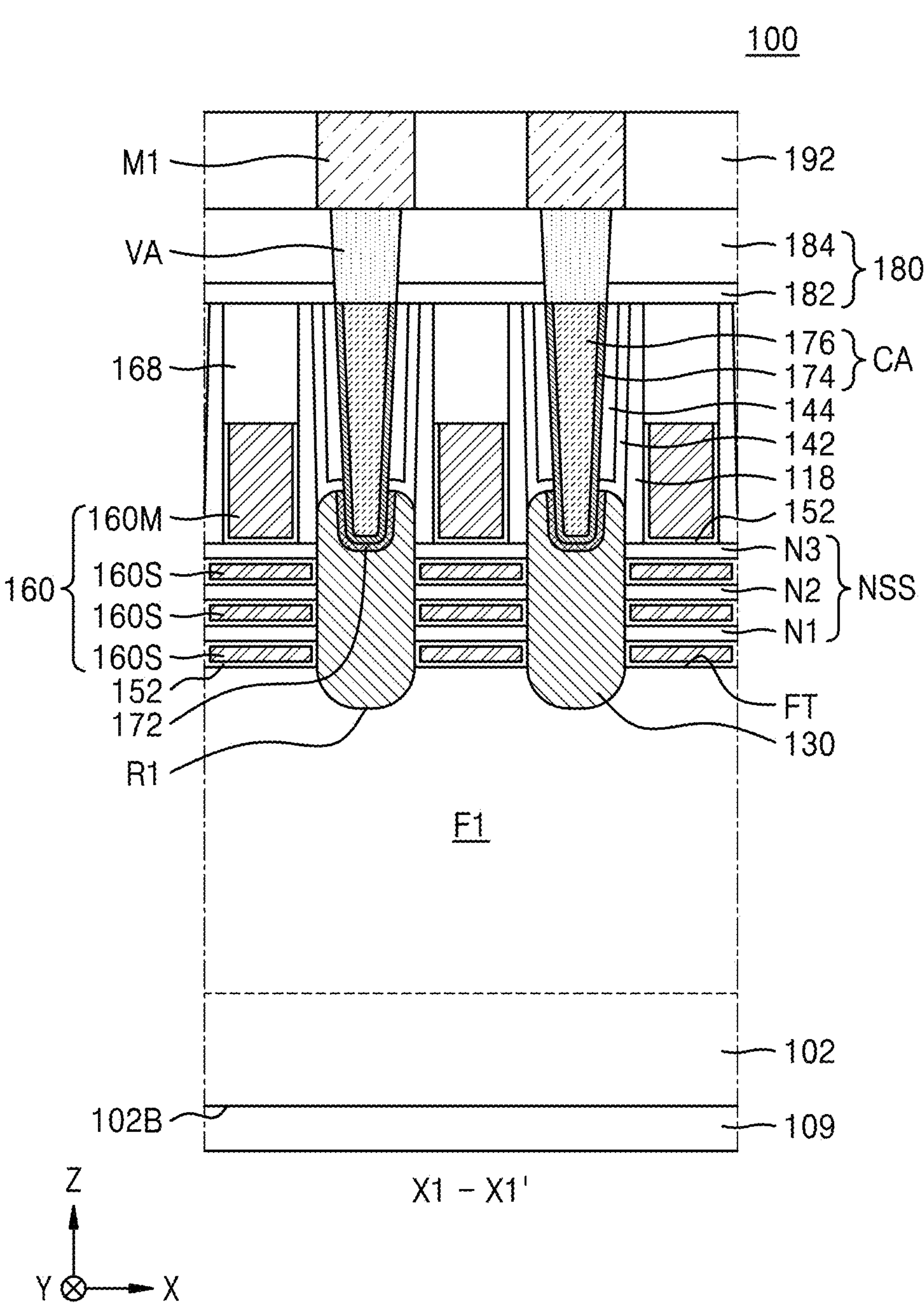
FIG. 3A is a cross-sectional view taken along line X1-X1' of FIG. 2.
Figure 3B:
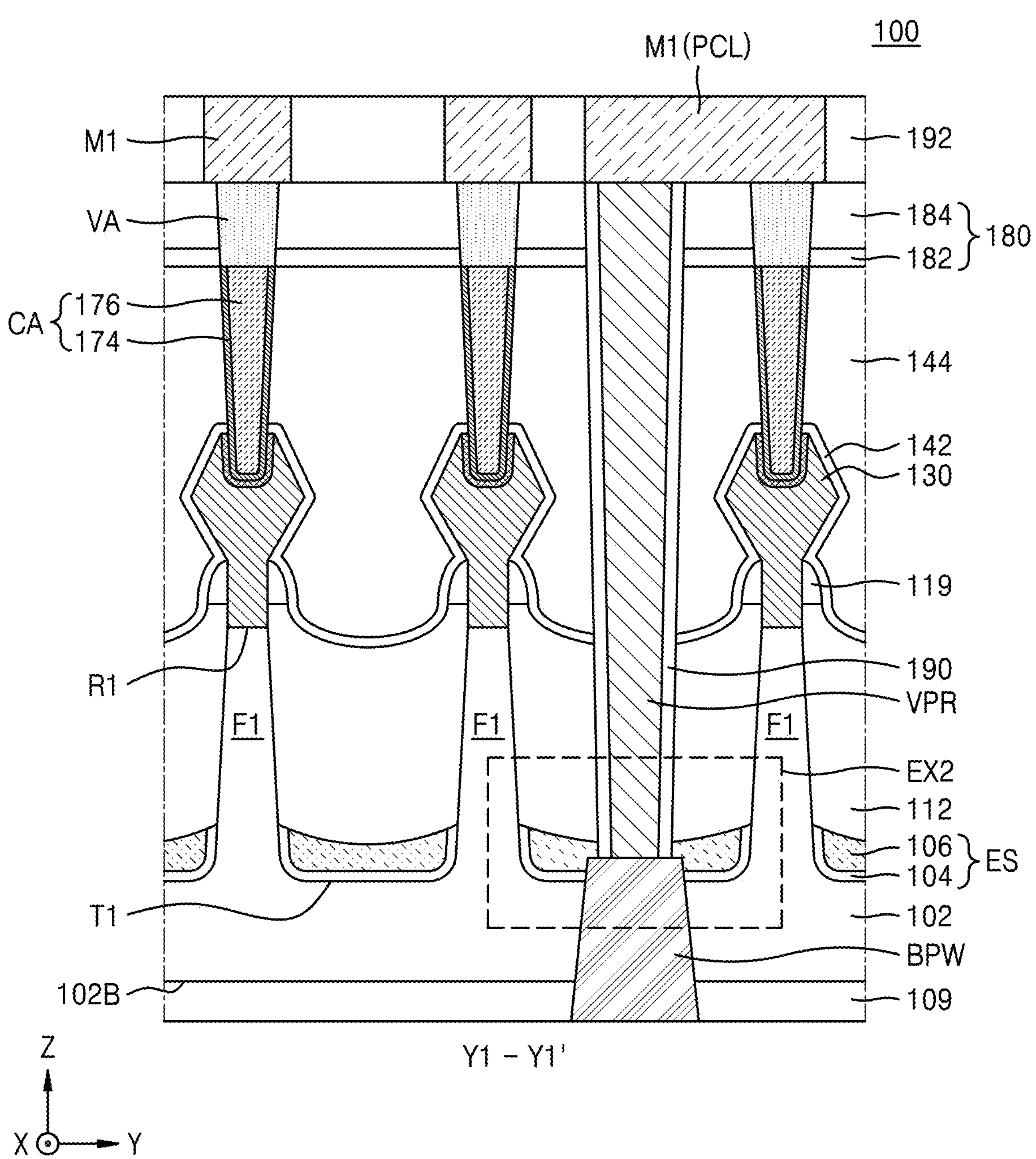
FIG. 3B is a cross-sectional view taken along line Y1-Y1' of FIG. 2.
Figure 3C:
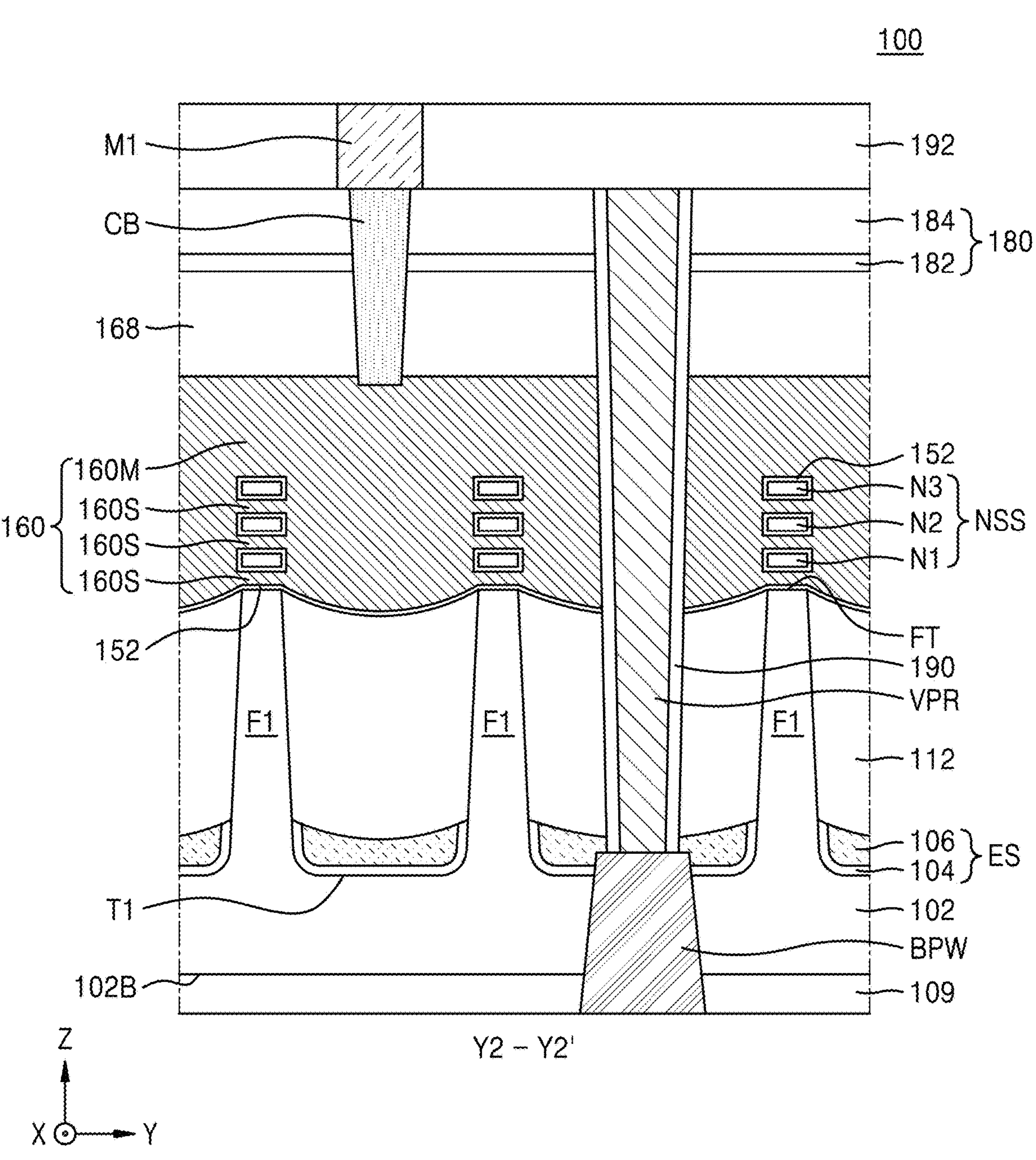
FIG. 3C is a cross-sectional view taken along line Y2-Y2' of FIG. 2.
Figure 3D:
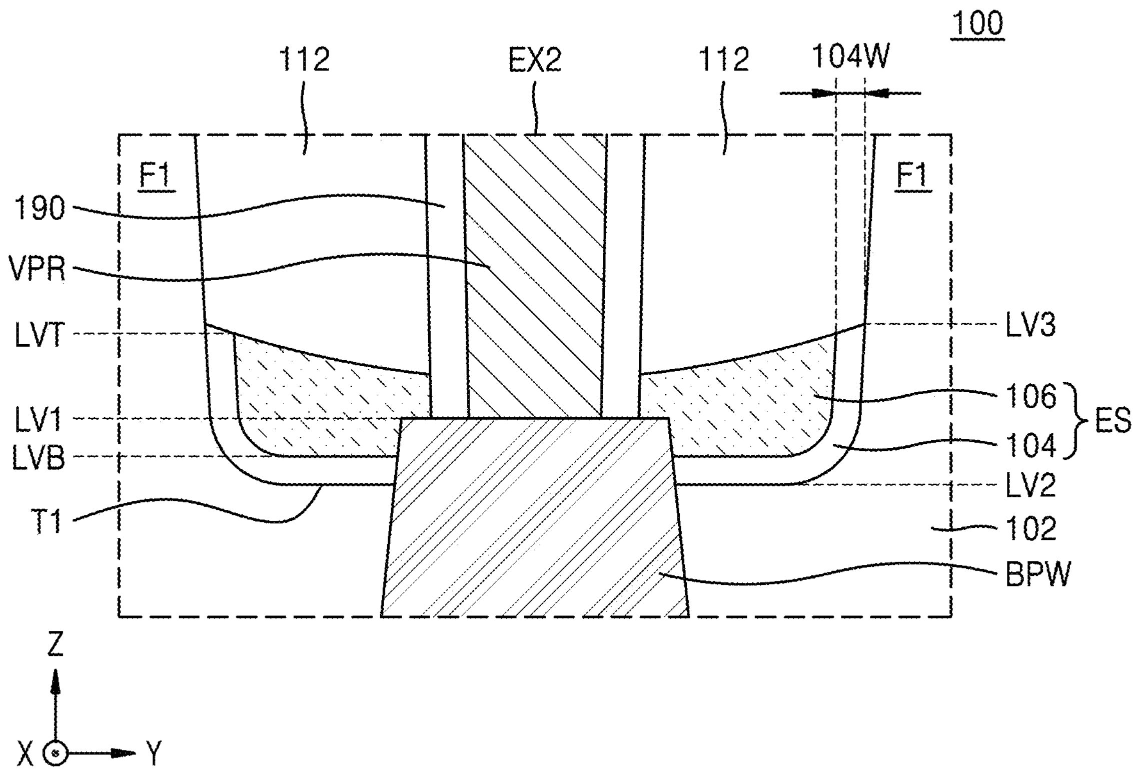
FIG. 3D is an enlarged cross-sectional view of portion "EX2" of FIG. 3B.

FIG. 2 is a plan layout diagram of an IC device 100 according to some example embodiments. FIG. 3A is a cross-sectional view taken along line X1-X1' of FIG. 2. FIG. 3B is a cross-sectional view taken along line Y1-Y1' of FIG. 2. FIG. 3C is a cross-sectional view taken along line Y2-Y2' of FIG. 2. FIG. 3D is an enlarged cross-sectional view of portion "EX2" of FIG. 3B. The IC device 100 including a field-effect transistor (FET) such as an n-type FET or a p-type FET having a gate-all-around structure including an active region of a nanowire and/or nanosheet type and a gate surrounding the active region is described with reference to FIGS. 2 and 3A to 3D. The IC device 100 may include some of the plurality of logic cells LC shown in FIG. 1. In some example embodiments, the IC device may include a multi-bridge channel FET (MBCFET™).

As shown in FIGS. 2 and 3A to 3D, the IC device 100 may include two logic cells LC, which are adjacent to each other with a via power rail VPR therebetween in a second lateral direction (Y direction). The via power rail VPR may constitute or correspond to the ground line VSS shown in FIG. 1.

The IC device 100 may include a substrate 102 having a back side surface 102B and a plurality of fin-type active regions F1 that protrude from the substrate 102 to define a plurality of trench regions T1 on the substrate 102 on an opposite side of the back side surface 102B. The plurality of fin-type active regions F1 may extend along parallel to each other in a first lateral direction (X direction) on the substrate 102.

The substrate 102 may include an elemental semiconductor, such as silicon (Si) or germanium (Ge), and/or a compound semiconductor, such as one or more of silicon germanium (SiGe), silicon carbide (SiC), gallium arsenide (GaAs), indium arsenide (InAs), or indium phosphide (InP). As used herein, each of the terms “SiGe,” “SiC,” “GaAs,” “InAs,” “InGaAs,” and “InP” refers to a material including elements included therein, without referring to a chemical formula representing a stoichiometric relationship. The substrate 102 may include a conductive region, for example, a doped well and/or a doped structure.

A device isolation film 112 may be in the trench region T1 defining the plurality of fin-type active regions F1. The device isolation film 112 may cover respective sidewalls of the plurality of fin-type active regions F1 in the plurality of trench regions T1 and be apart from the substrate 102 in a vertical direction (Z direction). The device isolation film 112 may include a silicon oxide film; however, example embodiments are not limited thereto, and in some example embodiments the device isolation film 112 may alternatively or additionally include a silicon nitride film.

As shown in FIGS. 3B, 3C, and 3D, an etch stop structure ES may be between the substrate 102 and the device isolation film 112. The etch stop structure ES may fill at least a portion of the trench region T1 between the substrate 102 and the device isolation film 112. The etch stop structure ES may include a portion in contact with the substrate 102 and a portion in contact with a lower sidewall of the fin-type active region F1 defining the trench region T1.

The etch stop structure ES may include an insulating liner 104 in contact with the substrate 102 and an insulating stopper 106 having a bottom surface and a sidewall, which are surrounded by the insulating liner 104. The insulating stopper 106 may have the bottom surface and the sidewall that are in contact with the insulating liner 104 and a top surface that is in contact with the device isolation film 112.

The insulating liner 104 and the insulating stopper 106 may include different materials from each other, and may or may not include at least one same material as each other. In some example embodiments, at least a portion of the insulating liner 104 may include a crystalline silicon film, an amorphous silicon film, an undoped silicon film, a silicon oxide film, or a combination thereof. For example, at least a portion of the insulating liner 104 may include a crystalline Si film, an amorphous Si film, an undoped Si film, or a combination thereof and may or may not include silicon nitride, and the insulating stopper 106 may include a silicon nitride film, and may or may not include (unnitrided) silicon.

As shown in FIGS. 3B and 3C, the via power rail VPR may extend in the vertical direction (Z direction) between a pair of fin-type active regions F1, which are selected from the plurality of fin-type active regions F1 and adjacent to each other, and between a pair of source/drain regions 130 on the pair of fin-type active regions F1. A sidewall of the via power rail VPR may be surrounded by an insulating spacer 190. In some example embodiments, the via power rail VPR may include a metal wiring layer and a conductive barrier layer surrounding the metal wiring layer. The metal wiring layer may include ruthenium (Ru), cobalt (Co), tungsten (W), or a combination thereof. The conductive barrier layer may include titanium (Ti), titanium nitride (TiN), tantalum (Ta), tantalum nitride (TaN), or a combination thereof. The insulating spacer 190 may include a silicon (Si) oxide film, a silicon oxynitride film, a silicon nitride film, or a combination thereof.

The back side surface 102B of the substrate 102 may be covered by a backside insulating film 109. The backside insulating film 109 may include a silicon oxide film, a silicon nitride film, silicon carbide film, a low-k dielectric film, or a combination thereof. The low-k dielectric film may include fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof, without being limited thereto.

As shown in FIGS. 3B and 3C, a backside power rail BPW may pass through the backside insulating film 109 and the substrate 102 in the vertical direction (Z direction). The backside power rail BPW may pass through the substrate 102 from the back side surface 102B of the substrate 102 in the vertical direction (Z direction) and be in contact with one end of the via power rail VPR. In some example embodiments, the backside power rail BPW may include a metal wiring layer and a conductive barrier layer surrounding the metal wiring layer. Detailed configurations of the metal wiring layer and the conductive barrier layer in the backside power rail BPW may be generally the same as those of the metal wiring layer and the conductive barrier layer in the via power rail VPR.

As shown in FIGS. 3B, 3C, and 3D, the via power rail VPR and the insulating spacer 190 may pass through a portion of the etch stop structure ES in the vertical direction (Z direction). The backside power rail BPW may pass through another portion of the etch stop structure ES in the vertical direction (Z direction) and be in contact with one end of the via power rail VPR. The via power rail VPR may pass through a portion of the etch stop structure ES, which has a thickness less than a total thickness of the etch stop structure ES in the vertical thickness (Z direction), in the vertical direction (Z direction). The backside power rail BPW may pass through the remaining portion of the etch stop structure ES, which is not penetrated by the via power rail VPR, in the vertical direction (Z direction). The remaining portion of the etch stop structure ES, which is not penetrated by the via power rail VPR, may have a thickness that is less than the total thickness of the etch stop structure ES in the vertical direction (Z direction). For example, at least a portion of the insulating stopper 106 included in the etch stop structure ES may have a thickness less than a total thickness of the insulating stopper 106 in the vertical direction (Z direction) and may be penetrated by the via power rail VPR in the vertical direction (Z direction). The remaining portion of the insulating stopper 106, which has a thickness less than the total thickness thereof in the vertical direction (Z direction) and is not penetrated by the via power rail VPR, may be penetrated by the backside power rail BPW in the vertical direction (Z direction).

As shown in FIG. 3D, a vertical level LV1 of a contact surface between the via power rail BPR and the backside power rail BPW may be between a bottom vertical level LV2 of the etch stop structure ES, which is closest to the back side surface 120B of the substrate 102, and a top vertical level LV3 of the etch stop structure ES, which is farthest from the back side surface 102B of the substrate 102. As used herein, the term "vertical level" may refer to a height from a main surface 102M of the substrate 102 in a vertical direction (Z direction or −Z direction). For example, the vertical level LV1 of the contact surface between the via power rail BPR and the backside power rail BPW may be higher than a bottom vertical level LVB of a lowermost surface of the insulating stopper 106 included in the etch stop structure ES and lower than a top vertical level LVT of an uppermost surface of the insulating stopper 106.

One end of the via power rail VPR, which is in contact with the backside power rail BPW, may be spaced apart from the insulating liner 104. The backside power rail BPW may pass through the insulating liner 104 in the vertical direction (Z direction), may pass through a portion of the insulating stopper 106 in the vertical direction (Z direction), and may contact the one end of the backside power rail BPW.

In the etch stop structure ES, a contact surface between the insulating liner 104 and the insulating stopper 106 may be apart from a sidewall defining the trench region T1, from among sidewalls of the fin-type active region F1 adjacent to the etching stop structure ES, by a thickness 104W of the insulating liner 104 and in a first lateral direction (X direction). A contact surface between the insulating liner 104 and the device isolation film 112 may be between the contact surface between the insulating liner 104 and the insulating stopper 106 and a sidewall of the fin-type active region F1. In some example embodiments, the contact surface between the insulating liner 104 and the device isolation film 112 may be in an extension line of a contact surface between the insulating stopper 106 and the device isolation film 112. In some example embodiments, the contact surface between the insulating liner 104 and the device isolation film 112 may be outside the extension line of the contact surface between the insulating stopper 106 and the device isolation film 112 according to a height of each of the insulating liner 104 and the insulating stopper 106 in the vertical direction (Z direction).

As shown in FIGS. 2, 3A, and 3C, a plurality of gate lines 160 may be on the plurality of fin-type active regions F1. Each of the plurality of gate lines 160 may extend along in a second lateral direction (Y direction), which intersects with (e.g. is orthogonal to) the first lateral direction (X direction). A plurality of nanosheet stacks NSS may be respectively on fin top surfaces FT of the plurality of fin-type active regions F1 at intersections between the plurality of fin-type active regions F1 and the plurality of gate lines 160. Each of the plurality of nanosheet stacks NSS may include at least one nanosheet, which is apart from the fin top surface FT of the fin-type active region F1 in the vertical direction (Z direction) and faces the fin top surface FT of the fin-type active region F1. As used herein, the term "nanosheet" refers to a conductive structure having a cross-section that is substantially perpendicular to a direction in which current flows. The nanosheet may be interpreted as including a nanowire.

As shown in FIGS. 3A and 3C, each of the plurality of nanosheet stacks NSS may include a first nanosheet N1, a second nanosheet N2, and a third nanosheet N3, which overlap each other in the vertical direction (Z direction) on the fin-type active region F1. The first nanosheet N1, the second nanosheet N2, and the third nanosheet N3 may be at different vertical distances (Z-directional distances) from the fin top surface FT of the fin-type active region F1. Each of the plurality of gate lines 160 may surround the first nanosheet N1, the second nanosheet N2, and the third nanosheet N3 of the nanosheet NSS, which overlap each other in the vertical direction (Z direction).

Although FIG. 2 illustrates a case in which the nanosheet stack NSS has a substantially rectangular planar shape, example embodiments are not limited thereto. The nanosheet stack NSS may have various planar shapes according to a planar shape of each of the fin-type active region F1 and the gate line 160. Example embodiments may pertain to a configuration in which the plurality of nanosheet stacks NSS and the plurality of gate lines 160 are formed on one fin-type active region F1, and the plurality of nanosheet stacks NSS are arranged in a line in the first lateral direction (X direction) on one fin-type active region F1. However, the number of nanosheet stacks NSS and/or the number of gate lines 160 on one fin-type active region F1 are not specifically limited.

Each of the first to third nanosheets N1, N2, and N3 included in the nanosheet stack NSS may function as a channel region. For example, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In some example embodiments, the first to third nanosheets N1, N2, and N3 may have substantially the same thickness in the vertical direction (Z direction). Alternatively, however, in some example embodiments, at least some of the first to third nanosheets N1, N2, and N3 may have different thicknesses in the vertical direction (Z direction). A spacing of neighboring nanosheets N1, N2, N3 may be the same as each other or at least one may be different from one another. In some example embodiments, each of the first nanosheet N1, the second nanosheet N2, and the third nanosheet N3 included in the nanosheet stack NSS may independently or jointly include a Si layer, a SiGe layer, or a combination thereof.

As shown in FIG. 3A, the first to third nanosheets N1, N2, and N3 included in one nanosheet stack NSS may have the same size or similar sizes in the first lateral direction (X direction). In some example embodiments, differently from that shown in FIG. 3A, at least some of the first to third nanosheets N1, N2, and N3 included in one nanosheet stack NSS may have different sizes in the first lateral direction (X direction). Example embodiments may pertain to an example in which each of the plurality of nanosheet stacks NSS includes three nanosheets, but example embodiments are not limited thereto. For example, the nanosheet stack NSS may include at least one nanosheet, and the number of nanosheets in the nanosheet stack NSS is not specifically limited; neighboring ones of nanosheet stacks NSS may have the same, or different, number of nanosheets.

As shown in FIGS. 3A and 3C, each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and respectively one-by-one arranged between the first to third nanosheets N1, N2, and N3 and between the first nanosheet N1 and the fin-type active region FA. In the vertical direction (Z direction), a thickness of each of the plurality of sub-gate portions 160S may be less than a thickness of the main gate portion 160M.

As shown in FIGS. 3A and 3B, a plurality of recesses R1 may be formed in the fin-type active region F1. A lowermost surface of each of the plurality of recesses R1 may be at a lower vertical level than the fin top surface FT of the fin-type active region F1.

As shown in FIGS. 3A and 3B, a plurality of source/drain regions 130 may be respectively inside the plurality of recesses R1. Each of the plurality of source/drain regions 130 may be adjacent to at least one gate line 160 selected from the plurality of gate lines 160. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

Each of the gate lines 160 may include a metal, a metal nitride, a metal carbide, or a combination thereof. The metal may be one or more selected from titanium (Ti), tungsten (W), ruthenium (Ru), niobium (Nb), molybdenum (Mo), hafnium (HD, nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. In some example embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some example embodiments, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

As shown in FIGS. 3A and 3C, a top surface of each of the gate dielectric film 152 and the gate line 160 may be covered by the capping insulating pattern 168. The capping insulating pattern 168 may include a silicon nitride film.

Both sidewalls of each of the gate line 160 and the capping insulating pattern 168 may be covered by outer insulating spacers 118. The outer insulating spacers 118 may cover both sidewalls of the main gate portion 160M on top surfaces of the plurality of nanosheet stacks NSS. The outer insulating spacers 118 may be apart from the gate line 160 with the gate dielectric film 152 therebetween.

As shown in FIG. 3B, a plurality of recess-side insulating spacers 119 may cover sidewalls of the source/drain region 130 on a top surface of the isolation film 112. In some example embodiments, the recess-side insulating spacers 119 may be respectively and integrally connected to the outer insulating spacer 118 adjacent thereto.

The plurality of outer insulating spacers 118 and the plurality of recess-side insulating spacers 119 may each include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

A metal silicide film 172 may be formed on a top surface of each of the plurality of source/drain regions 130. The metal silicide film 172 may include a metal, which includes one or more of titanium (Ti), tungsten (W), ruthenium (Ru), niobium (Nb), molybdenum (Mo), hafnium (HD, nickel (Ni), cobalt (Co), platinum (Pt), ytterbium (Yb), terbium (Tb), dysprosium (Dy), erbium (Er), or palladium (Pd). For example, the metal silicide film 172 may include titanium silicide, without being limited thereto.

On the substrate 102, the plurality of source/drain regions 130, a plurality of metal silicide films 172, and the plurality of outer insulating spacers 118 may be covered by an insulating liner 142. In some example embodiments, the insulating liner 142 may be omitted. An inter-gate dielectric film 144 may be on the insulating liner 142. When the insulating liner 142 is omitted, the inter-gate dielectric film 144 may be in contact with the plurality of source/drain regions 130.

The insulating liner 142 and the inter-gate dielectric film 144 may be sequentially arranged on the plurality of source/drain regions 130 and the plurality of metal silicide films 172. The insulating liner 142 and the inter-gate dielectric film 144 may constitute an insulating structure. In some example embodiments, the insulating liner 142 may include silicon nitride, SiCN, SiBN, SiON, SiOCN, SiBCN, or a combination thereof, without being limited thereto. The inter-gate dielectric film 144 may include a silicon oxide film, without being limited thereto.

Both sidewalls of each of the plurality of sub-gate portions 160S included in the plurality of gate lines 160 may be apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

The plurality of nanosheet stacks NSS may be respectively on the fin top surfaces FT of the plurality of fin-type active regions F1 in regions where the plurality of fin-type active regions F1 intersect with the plurality of gate lines 160. Each of the plurality of nanosheet stacks NSS may be apart from the fin-type active region F1 and face the fin top surface FT of the fin-type active region F1. On the substrate 102, a plurality of nanosheet transistors may be formed at intersections between the plurality of fin-type active regions F1 and the plurality of gate lines 160.

As shown in FIGS. 3A and 3B, a plurality of source/drain contacts CA may be on the plurality of source/drain regions 130. Each of the plurality of source/drain contacts CA may pass through the inter-gate dielectric film 144 and the insulating liner 142 in the vertical direction (Z direction) and be in contact with the metal silicide film 172. Each of the plurality of source/drain contacts CA may be electrically connectable to the source/drain region 130 through the metal silicide film 172. Each of the plurality of source/drain contacts CA may be apart from the main gate portion 160M with the outer insulating spacer 118 therebetween in the first lateral direction (X direction).

Each of the plurality of source/drain contacts CA may include a conductive barrier pattern 174 and a contact plug 176, which are sequentially stacked on the source/drain region 130. The conductive barrier pattern 174 may surround and contact a bottom surface and a sidewall of the contact plug 176. Each of the plurality of source/drain contacts CA may pass through the inter-gate dielectric film 144 and the insulating liner 142 and extend long in the vertical direction (Z direction). The conductive barrier pattern 174 may be between the metal silicide film 172 and the contact plug 176. The conductive barrier pattern 174 may have a surface in contact with the metal silicide film 172 and a surface in contact with the contact plug 176. In some example embodiments, the conductive barrier pattern 174 may include a metal or a metal nitride. For example, the conductive barrier pattern 174 may include titanium (Ti), tantalum (Ta), tungsten (W), titanium nitride (TiN), tantalum (TaN), tungsten nitride (WN), tungsten carbon nitride (WCN), titanium silicon nitride (TiSiN), tantalum silicon nitride (TaSiN), tungsten silicon nitride (WSiN), or a combination thereof, without being limited thereto. The contact plug 176 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

As shown in FIG. 3B, from among the plurality of source/drain contacts CA, the source/drain contact CA adjacent to the via power rail VPR may be apart from the via power rail VPR in the second lateral direction (Y direction).

As shown in FIGS. 3A to 3C, a top surface of each of the plurality of source/drain contacts CA, the plurality of capping insulating patterns 168, and the inter-gate dielectric film 144 may be covered with an upper insulating structure 180. The upper insulating structure 180 may include an etch stop film 182 and an interlayer insulating film 184, which are sequentially stacked on each of the plurality of source/drain contacts CA, the plurality of capping insulating patterns 168, and the inter-gate dielectric film 144. The etch stop film 182 may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 184 may include an oxide film, a nitride film, an ultralow-k (ULK) film having an ultralow dielectric constant K of about 2.2 to about 2.4, or a combination thereof. For example, the interlayer insulating film 184 may include a tetraethylorthosilicate (TEOS) film, a high-density plasma (HDP) film, a boro-phospho-silicate glass (BPS G) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof, without being limited thereto.

As shown in FIGS. 3A and 3B, a plurality of source/drain via contacts VA may be on the plurality of source/drain contacts CA. Each of the plurality of source/drain via contacts VA may pass through the upper insulating structure 180 and be in contact with the source/drain contact CA. Each of the plurality of source/drain regions 130 may be electrically connected to the source/drain via contact VA through the metal silicide film 172 and the source/drain contact CA. A bottom surface of each of the plurality of source/drain via contacts VA may be in contact with the top surface of the source/drain contact CA. Each of the plurality of source/drain via contacts VA may include molybdenum (Mo) or tungsten (W), without being limited thereto.

As shown in FIGS. 2 and 3C, a gate contact CB may be on the gate line 160. The gate contact CB may be connected to the gate line 160 by passing through the upper insulating structure 180 and the capping insulating pattern 168 in the vertical direction (Z direction). A bottom surface of the gate contact CB may be in contact with a top surface of the gate line 160. The gate contact CB may include a contact plug, which includes molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but a constituent material of the contact plug is not limited thereto. In some example embodiments, the gate contact CB may further include a conductive barrier pattern surrounding a portion of the contact plug. The conductive barrier pattern included in the gate contact CB may include a metal or a metal nitride. For example, the conductive barrier pattern may include Ti, Ta, W, TiN, TaN, WN, WCN, TiSiN, TaSiN, WSiN, or a combination thereof, without being limited thereto.

The via power rail VPR and the insulating spacer 190 may pass through the upper insulating structure 180, the capping insulating pattern 168, the gate line 160, the inter-gate dielectric film 144, the insulating liner 142, and the device isolation film 112 in the vertical direction (Z direction). A portion of the gate line 160, which are penetrated by the via power rail VPR and the insulating spacer 190, may be a region between the plurality of nanosheet stacks NSS. The via power rail VPR may be apart from the gate line 160 with the insulating spacer 190) therebetween in a lateral direction (e.g., the second lateral direction (Y direction)). The via power rail VPR and the insulating spacer 190 may be apart from the plurality of source/drain regions 130 in the lateral direction (e.g., the second lateral direction (Y direction)).

In some example embodiments, a top surface of one end of the via power rail VPR, which is opposite to another end of the via power rail VPR in contact with the backside power rail BPW, a top surface of the upper insulating structure 180, a top surface of each of the plurality of source/drain via contacts VA, and a top surface of the gate contact CB may be coplanar with each other.

As shown in FIGS. 3B and 3C, the etch stop structure ES may include a portion overlapping the gate line 160 and a portion overlapping the inter-gate dielectric film 144 in the vertical direction (Z direction). The etch stop structure ES may be between the substrate 102 and the device isolation film 122 at the bottom of the trench region T1 on the substrate 102. The etch stop structure ES may include a portion overlapping the gate line 160 with the device isolation film 112 therebetween in the vertical direction (Z direction) and a portion overlapping the inter-gate dielectric film 144 with the device isolation film 112 therebetween in the vertical direction (Z direction).

The top surface of the upper insulating structure 180, a top surface of the via power rail VPR, the top surface of each of the plurality of source/drain via contacts VA, and the top surface of the gate contact CB may be covered by an upper insulating film 192. A constituent material of the upper insulating film 192 may be substantially the same as that of the interlayer insulating film 184.

A plurality of upper wiring layers M1 may pass through the upper insulating film 192. Each of the plurality of upper wiring layers M1 may be connected to a selected one of the plurality of source/drain via contacts VA located thereunder or a selected one of a plurality of gate contacts (refer to CB in FIG. 2). The plurality of upper wiring layers M1 may include molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, without being limited thereto.

The plurality of upper wiring layers M1 may include a power connection conductive layer PCL connected to the via power rail VPR on the via power rail VPR. A selected one of the plurality of source/drain via contacts VA may be apart from the via power rail VPR in the second lateral direction (Y direction) and connected between the source/drain contact CA and the power connection conductive layer PCL. From among the plurality of source/drain regions 130, the source/drain region connected to the via power rail VPR may be electrically connected to the via power rail VPR through the source/drain contact CA, the source/drain via contact VA, and the power connection conductive layer PCL.

As described above with reference to FIGS. 2 and 3A to 3D, the IC device 100 may include the etch stop structure ES between the substrate 102 and the device isolation film 112. The insulating stopper 106 included in the etch stop structure ES may include an insulating film having a dense structure, for example, a dense silicon nitride film. Accordingly, when an etching process for forming a hole having a relatively great planar area to pass through the upper insulating structure 180, the inter-gate dielectric film 144, the insulating liner 142, and the device isolation film 112 in the vertical direction (Z direction) is performed to form the via power rail VPR taking up a relatively great planar area during the manufacture of the IC device 100, a completion point of the etching process may be precisely controlled by setting the etch stop structure ES as an etch stop point.

Figure 4:
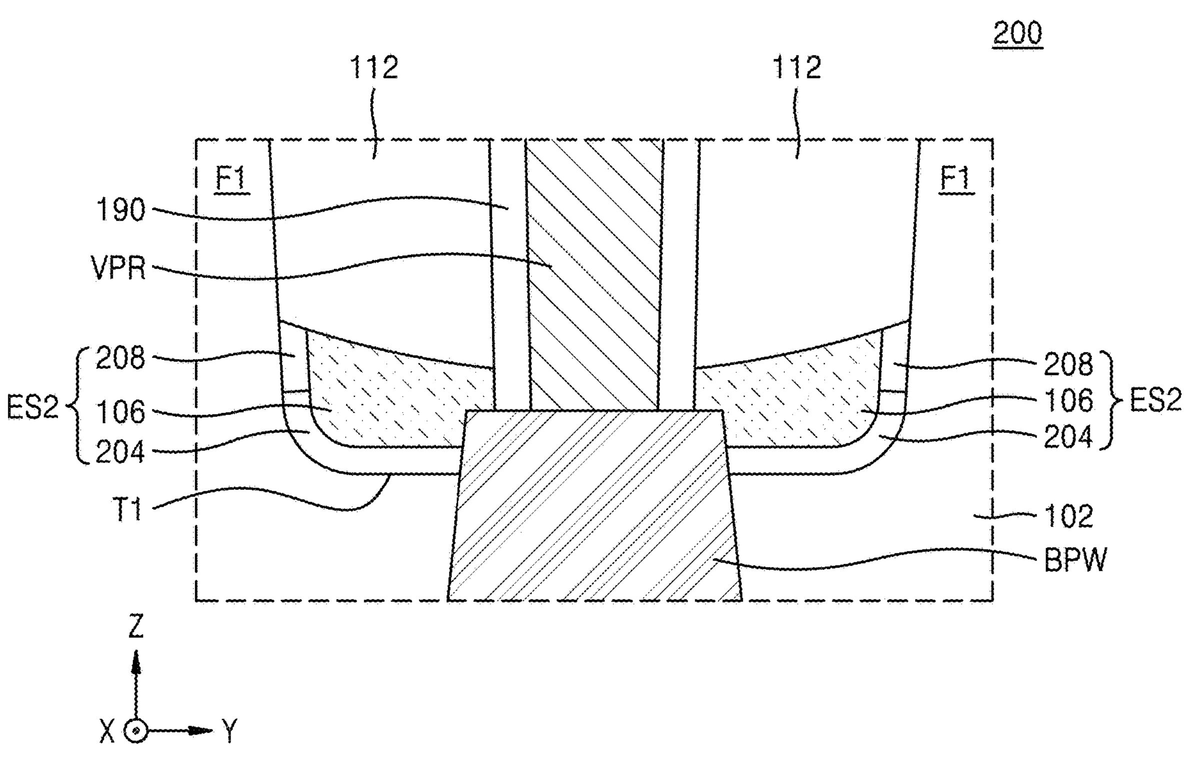
FIG. 4 is a cross-sectional view of an IC device according to some example embodiments.

FIG. 4 is a cross-sectional view of an IC device 200 according to some example embodiments. FIG. 4 illustrates an enlarged cross-sectional configuration of a portion corresponding to portion "EX2" of FIG. 3B in the IC device 200. The IC device 200 may include some of the plurality of logic cells LC shown in FIG. 1. In FIG. 4, the same reference numerals are used to denote the same elements as in FIGS. 2 and 3A to 3D, and repeated descriptions thereof are omitted here.

Referring to FIG. 4, the IC device 200 may substantially have the same configuration as the IC device 100 described with reference to FIGS. 2 and 3A to 3D. However, the IC device 200 may include an etch stop structure ES2.

The etch stop structure ES2 may substantially have the same configuration as the etch stop structure ES described with reference to FIGS. 3B to 3D. However, the etch stop structure ES2 may include an insulating liner 204, an insulating stopper 106, and an oxide pattern 208.

The insulating liner 204 may include a portion in contact with a substrate 102, a portion in contact with the insulating stopper 106, and a portion in contact with a lower sidewall of a fin-type active region F1. A bottom surface of the insulating stopper 106 and a portion of a sidewall of the insulating stopper 106, which is adjacent to the bottom surface thereof, may be surrounded by the insulating liner 204. The oxide pattern 208 may be between the insulating stopper 106 and a sidewall of the fin-type active region F1 under the device isolation film 112. A bottom surface of the oxide pattern 208 may be in contact with a top surface of the insulating liner 204, and a top surface of the oxide pattern 208 may be in contact with the device isolation film 112. A constituent material of the insulating liner 204 may be substantially the same as a constituent material of the insulating liner 104, which has been described with reference to FIGS. 3B to 3D. The oxide pattern 208 may include silicon oxide. In some example embodiments, each of the insulating liner 204 and the oxide pattern 208 may include a silicon (Si)-containing film, and a Si content of the insulating liner 204 may be higher than a Si content of the oxide pattern 208. For example, the insulating liner 204 may include a crystalline Si film, an amorphous Si film, an undoped Si film, or a combination thereof, and the oxide pattern 208 may include a silicon oxide film.

Figure 5:
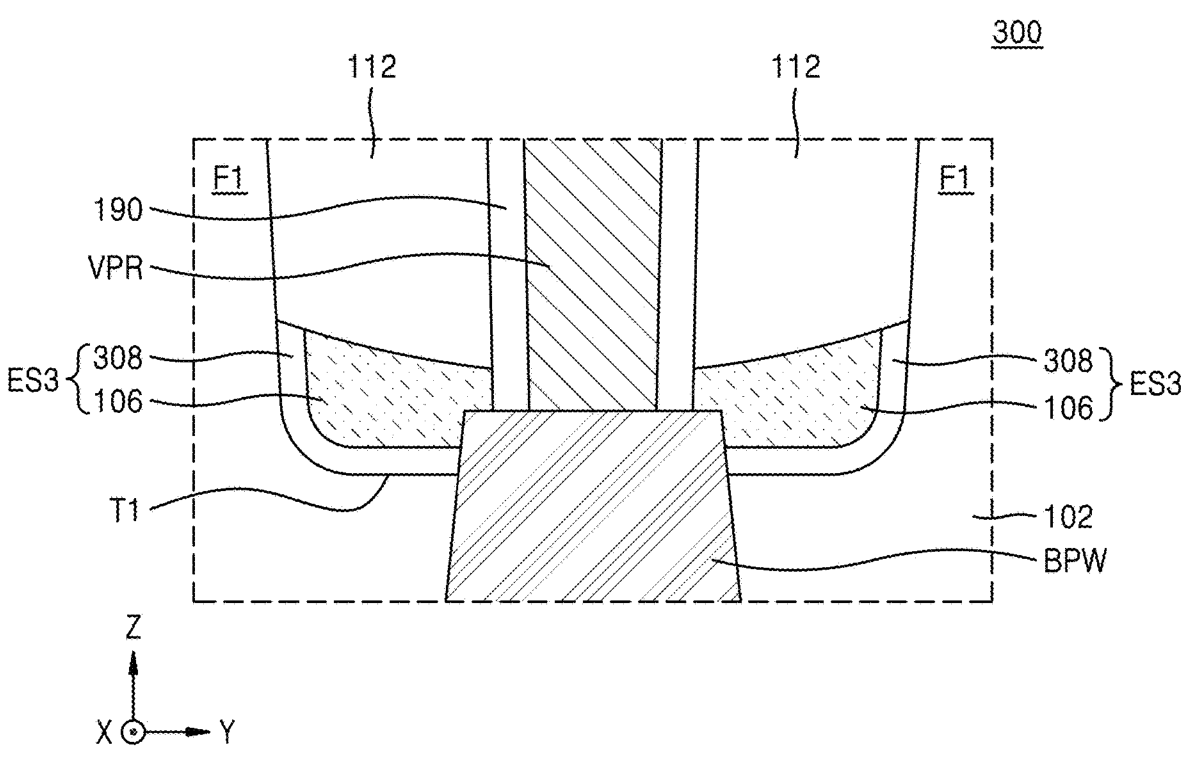
FIG. 5 is a cross-sectional view of an IC device according to some example embodiments.

FIG. 5 is a cross-sectional view of an IC device 300 according to some example embodiments. FIG. 5 illustrates an enlarged cross-sectional configuration of a portion corresponding to portion "EX2" of FIG. 3B in the IC device 300. The IC device 300 may include some of the plurality of logic cells LC shown in FIG. 1. In FIG. 5, the same reference numerals are used to denote the same elements as in FIGS. 2 and 3A to 3D, and repeated descriptions thereof are omitted here.

Referring to FIG. 5, the IC device 300 may substantially have the same configuration as the IC device 100 described with reference to FIGS. 2 and 3A to 3D. However, the IC device 300 may include an etch stop structure ES3.

The etch stop structure ES3 may substantially have the same configuration as the etch stop structure ES described with reference to FIGS. 3B to 3D. However, the etch stop structure ES3 may include an insulating liner 308 and an insulating stopper 106.

The insulating liner 308 may include a portion in contact with a substrate 102, a portion in contact with the insulating stopper 106, a portion in contact with a bottom surface of the device isolation film 112, and a portion in contact with a lower sidewall of the fin-type active region F1. A bottom surface and a sidewall of the insulating stopper 106 may be surrounded by the insulating liner 308. At least a portion of the insulating liner 308 may include a silicon oxide film, the content of oxygen atoms in the insulating liner 308 may increase toward the device isolation film 112, and the content of silicon atoms in the insulating liner 308 may increase in a direction away from the device isolation film 112. A portion of the insulating liner 308, which is farthest from the device isolation film 112, may include a crystalline Si film, an amorphous Si film, an undoped Si film, or a combination thereof.

Figure 6:
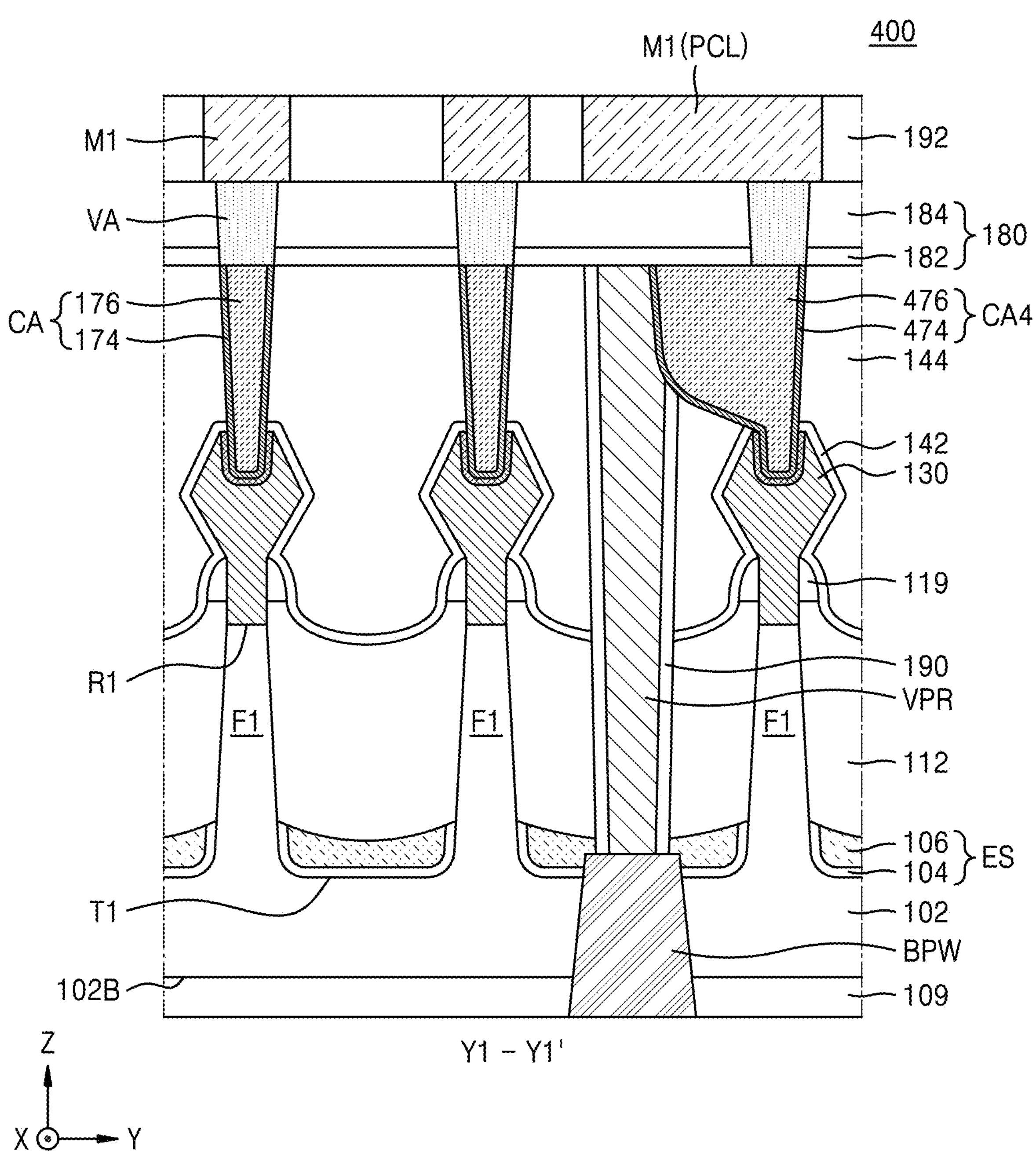
FIG. 6 is a cross-sectional view of an IC device according to some example embodiments.

FIG. 6 is a cross-sectional view of an IC device 400 according to some example embodiments. FIG. 6 illustrates a cross-sectional configuration of a portion corresponding to a cross-section taken along line Y1-Y1' of FIG. 2 in the IC device 400. In FIG. 6, the same reference numerals are used to denote the same elements as in FIGS. 2 and 3A to 3D, and repeated descriptions thereof are omitted here. The IC device 400 may include some of the plurality of logic cells LC shown in FIG. 1.

Referring to FIG. 6, the IC device 400 may substantially have the same configuration as the IC device 100 described with reference to FIGS. 2 and 3A to 3D. However, in the IC device 400, a source/drain contact CA4 may be formed on a source/drain region 130 connected to a via power rail VPR, from among a plurality of source/drain regions 130. The source/drain contact CA4 may be connected to the source/drain region 130 connected to the via power rail VPR and the via power rail VPR, and thus, the source/drain region 130 and the via power rail VPR may be electrically connectable to each other. In a second lateral direction (Y direction), the source/drain contact CA4 may have a greater width than a source/drain contact CA, which is formed on another source/drain region 130 that is not connected to the via power rail VPR, from among the plurality of source/drain regions 130.

The source/drain contact CA4 may include a conductive barrier pattern 474 and a contact plug 476, which are sequentially stacked on the source/drain region 130. The conductive barrier pattern 474 may include a portion in contact with the metal silicide film 172 and a portion in contact with the via power rail VPR. Detailed configurations of the conductive barrier pattern 474 and the contact plug 476 may be substantially the same as the conductive barrier pattern 174 and the contact plug 176, respectively, which have been described with reference to FIGS. 3A and 3B.

A selected one of source/drain via contacts VA may be connected between the source/drain contact CA4 and the power connection conductive layer PCL, and thus, the source/drain contact CA4 may be electrically connectable to a front-side wiring structure located over a plurality of upper wiring layers M1.

Figure 7:
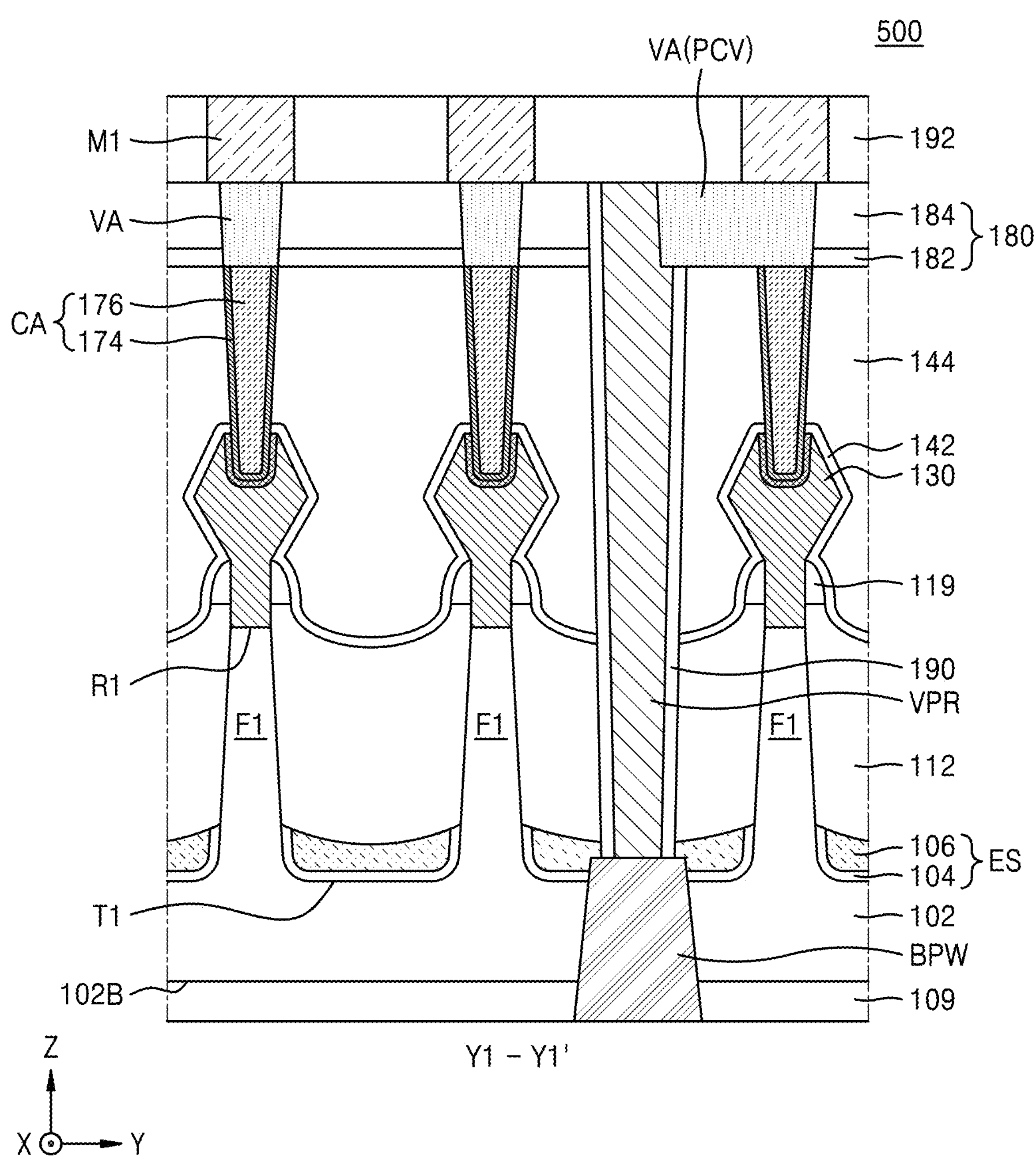
FIG. 7 is a cross-sectional view of an IC device according to some example embodiments.

FIG. 7 is a cross-sectional view of an IC device 500 according to some example embodiments. FIG. 7 illustrates a cross-sectional configuration of a portion corresponding to the cross-section taken along line Y1-Y1' of FIG. 2 in the IC device 500. In FIG. 7, the same reference numerals are used to denote the same elements as in FIGS. 2 and 3A to 3D, and repeated descriptions thereof are omitted here. The IC device 500 may include some of the plurality of logic cells LC shown in FIG. 1.

Referring to FIG. 7, the IC device 500 may substantially have the same configuration as the IC device 100 described with reference to FIGS. 2 and 3A to 3D. However, in the IC device 500, a plurality of source/drain via contacts VA may include a power connection via PCV connected to a via power rail VPR.

A source/drain contact CA and the power connection via PCV may be sequentially stacked on a source/drain region 130 connected to the via power rail VPR, from among a plurality of source/drain regions 130. The source/drain contact CA on the source/drain region 130 connected to the via power rail VPR may substantially have the same configuration as the source/drain contact CA on the source/drain region 130 that is not connected to the via power rail VPR. In a second lateral direction (Y direction), the power connection via PCV may have a greater width than another source/drain via contact VA that is not connected to the via power rail VPR, from among the plurality of source/drain via contacts VA. The power connection via PCV may be at the same vertical level as and include the same material as the source/drain via contact VA that is not connected to the via power rail VPR.

The power connection via PCV may be connected between the via power rail VPR and the source/drain contact CA located on the source/drain region 130 connected to the via power rail VPR, and thus, the source/drain region 130 may be electrically connectable to the via power rail VPR through the source/drain contact CA and the power connection via PCV.

The power connection via PCV may be connected to a selected one of a plurality of upper wiring layers M1 and electrically connectable to a front-side wiring structure located over the plurality of upper wiring layers M1 through the selected upper wiring layer M1.

Similar to the IC device 100 described with reference to FIGS. 2 and 3A to 3D, the IC devices 200, 300, 400, and 500 described with reference to FIGS. 4 to 7 may include the etch stop structures ES, ES2, and ES3 between the substrate 102 and the device isolation film 112. The insulating stopper 106 included in each of the etch stop structures ES, ES2, and ES3 may include an insulating film having a dense structure, for example, a dense silicon nitride film. Accordingly, when an etching process for forming a hole having a relatively great planar area to pass through the upper insulating structure 180, the inter-gate dielectric film 144, the insulating liner 142, and the device isolation film 112 in the vertical direction (Z direction) is performed to form the via power rail VPR taking up a relatively great planar area during the manufacture of the IC devices 200, 300, 400, and 500, a completion point of the etching process may be precisely controlled by setting the etch stop structures ES, ES2, and ES3 as etch stop points.

Next, examples of methods of manufacturing an IC device, according to some example embodiments, are described.

FIGS. 8 to 21C are cross-sectional views of a process sequence of a method of manufacturing an IC device, according to some example embodiments. More specifically, FIGS. 8 to 12, 13B, 14, 15B, 19B, 20B, and 21B are cross-sectional views of example cross-sectional structures of a portion corresponding to a cross-section taken along line Y1-Y1' of FIG. 2, according to a process sequence. FIGS. 13A, 15A, 16, 17, 18, 19A, 20A, and 21A are cross-sectional views of example cross-sectional structures of a portion corresponding to a cross-section taken along line X1-X1' of FIG. 2, according to a process sequence. FIGS. 13C, 15C, 19C, 20C, and 21C are cross-sectional views of example cross-sectional structures of a portion corresponding to a cross-section taken along line Y2-Y2' of FIG. 2, according to a process sequence. An example of a method of manufacturing the IC device 100 shown in FIGS. 2 and 3A to 3D will be described with reference to FIGS. 8 to 21C. In FIGS. 8 to 21C, the same reference numerals are used to denote the same elements as in FIGS. 2 and 3A to 3D, and repeated descriptions thereof are omitted here.

Figure 8:
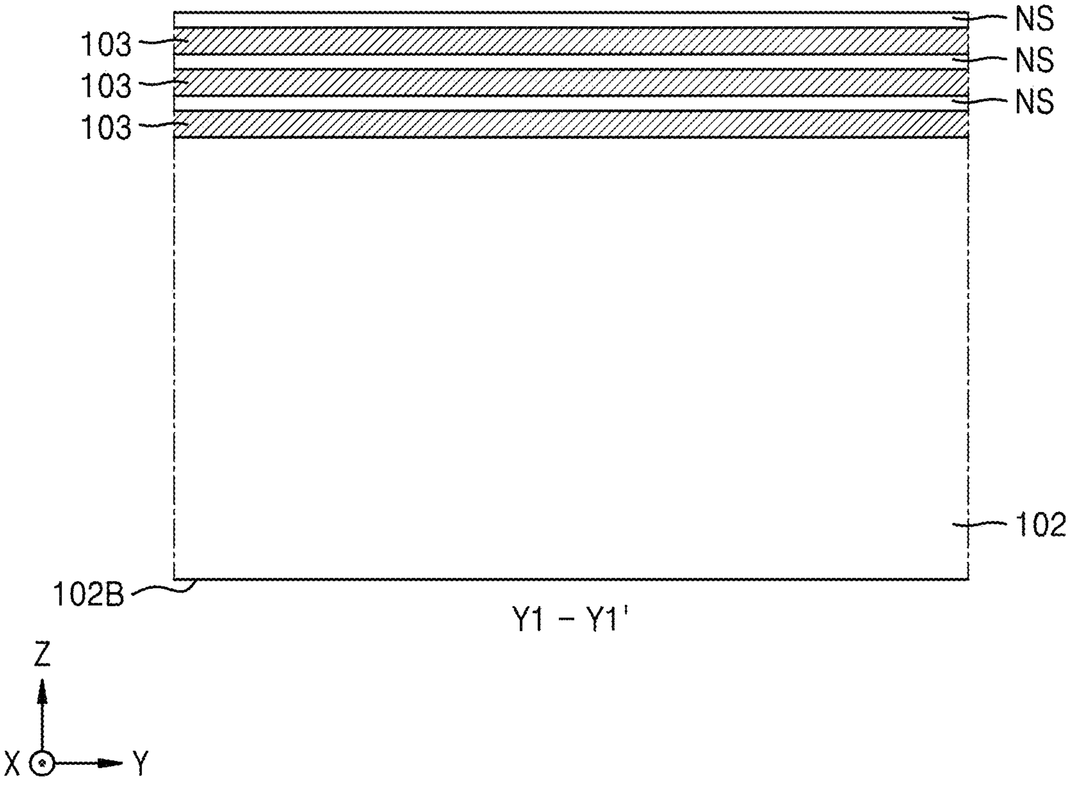

Referring to FIG. 8, a plurality of sacrificial semiconductor layers 103 and a plurality of nanosheet semiconductor layers NS may be alternately stacked one by one on a substrate 102.

The plurality of sacrificial semiconductor layers 103 and the plurality of nanosheet semiconductor layers NS may include semiconductor materials having different etch selectivities from each other. In some example embodiments, the plurality of nanosheet semiconductor layers NS may include a Si layer, and the plurality of sacrificial semiconductor layers 103 may include a SiGe layer. In some example embodiments, the plurality of sacrificial semiconductor layers 103 may have a constant Ge content. The SiGe layer included in the plurality of sacrificial semiconductor layers 103 may have a constant Ge content, which is selected in a range of about 5 at % to about 60 at %, for example, about 10 at % to about 40 at %. The Ge concentration of the SiGe layer included in the plurality of sacrificial semiconductor layers 103 may be variously selected as needed.

Figure 9:
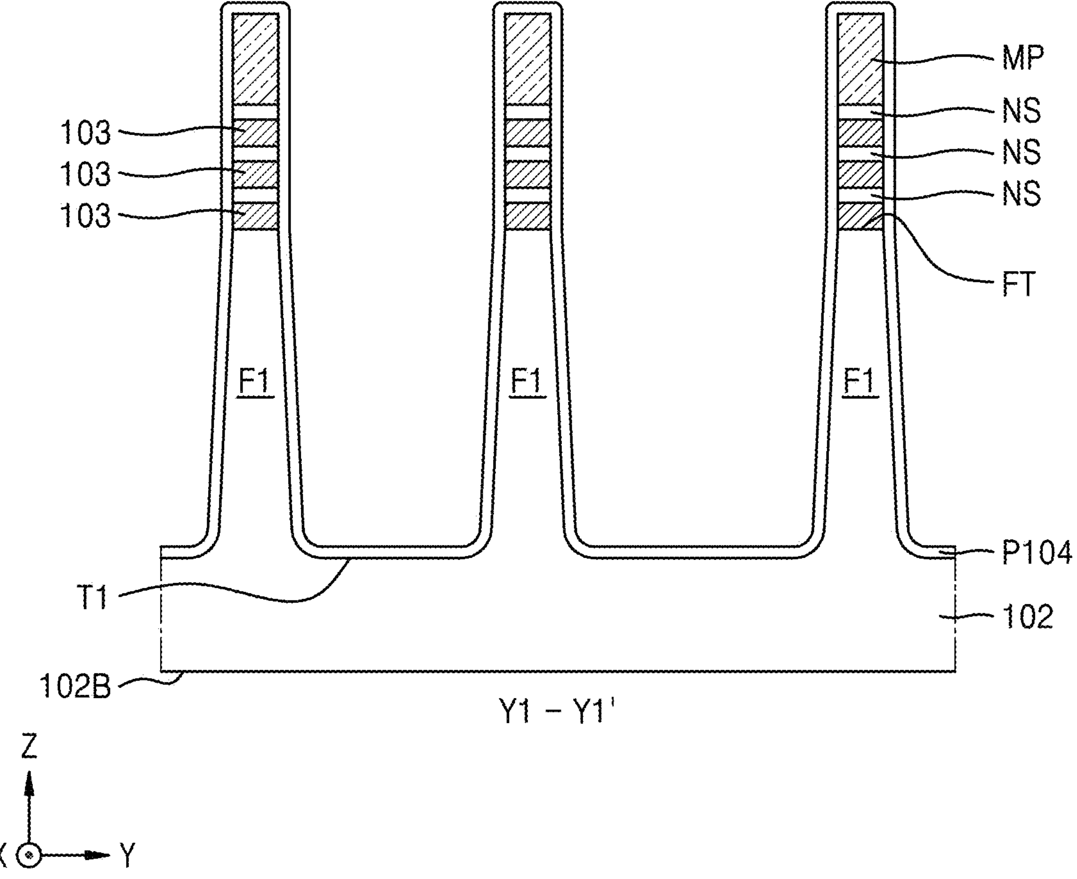

Referring to FIG. 9, a mask pattern MP may be formed on the resultant structure of FIG. 8. Thereafter, the plurality of sacrificial semiconductor layers 103, the plurality of nanosheet semiconductor layers NS, and the substrate 102 may be partially etched by using the mask pattern MP as an etch mask, and thus, a plurality of fin-type active regions F1 may be formed on the substrate 102. A plurality of trench regions T1 may be defined by the plurality of fin-type active regions F1 on the substrate 102. In some example embodiments, the mask pattern MP may have a stack structure of an oxide pattern and a silicon nitride film pattern. The mask pattern MP may extend parallel to each other in a first lateral direction (X direction) on the substrate 102. Stack structures of the plurality of sacrificial semiconductor layers 103 and the plurality of nanosheet semiconductor layers NS may remain on a fin top surface FT of each of the plurality of fin-type active regions F1.

Thereafter, a semiconductor liner P104 may be formed to conformally cover exposed surfaces on the substrate 102. In some example embodiments, the semiconductor liner P104 may include a crystalline Si film, an amorphous Si film, an undoped Si film, or a combination thereof. In some example embodiments, to form the semiconductor liner P104, a semiconductor layer may be grown from respective exposed surfaces of the substrate 102, the fin-type active region F1, the plurality of sacrificial semiconductor layers 103, and the plurality of nanosheet semiconductor layers NS by using a vapor phase epitaxy process or a liquid-phase epitaxy process. In some example embodiments, of the semiconductor liner P104, portions covering the respective surfaces of the substrate 102, the fin-type active region F1, the plurality of sacrificial semiconductor layers 103, and the plurality of nanosheet semiconductor layers NS may include a crystalline semiconductor layer. In some example embodiments, a portion of the semiconductor liner P104, which covers the mask pattern MP, may include an amorphous semiconductor layer.

Figure 10:
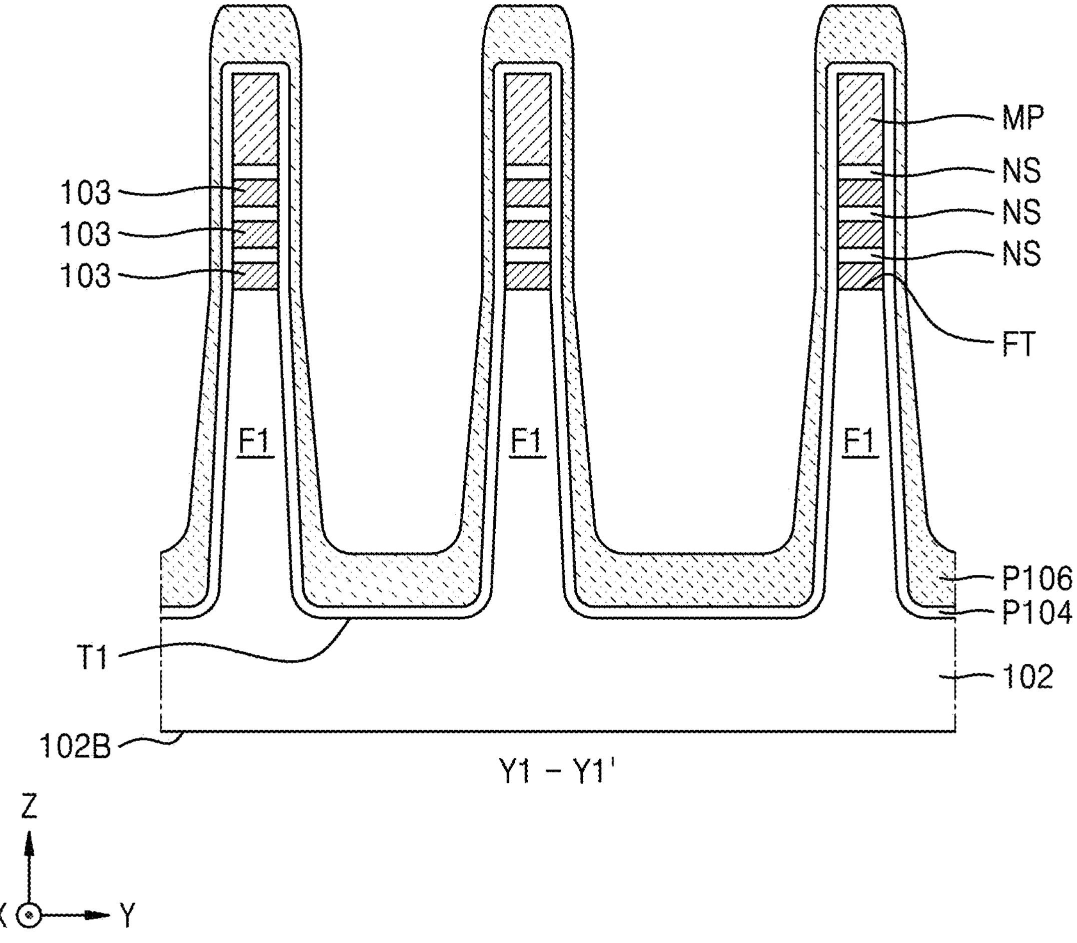

Referring to FIG. 10, an area selective atomic layer deposition (AS-ALD) process may be performed to enable selective deposition according to a surface topology, and thus, a topper insulating film P106 may be formed on the resultant structure of FIG. 9. The stopper insulating film P106 may have a relatively great thickness on surfaces (e.g., a bottom surface of the trench region T1), which are substantially parallel to a back side surface 102B of the substrate 102, and have a relatively small thickness on surfaces (e.g., a sidewall of each of the plurality of fin-type active regions F1), which are inclined in approximately in a vertical direction with respect to the back side surface 102B, from among surfaces exposed at a front side surface opposite to the back side surface 102B of the substrate 102. To form the stopper insulating film P106 having different thicknesses according to a surface topology on the substrate 102 as described above, the AS-ALD process may be performed under a condition where a step coverage of the stopper insulating film P106 deteriorates. The stopper insulating film P106 may include a silicon nitride film.

Thereafter, the stopper insulating film P106 may be densified. In some example embodiments, to densify the stopper insulating film P106, hydrogen ($H_2$) gas and nitrogen-containing gas may be activated in a plasma atmosphere, and the activated hydrogen ($H_2$) gas and nitrogen-containing gas may be supplied to the stopper insulating film P106. The nitrogen-containing gas may include $N_2$ gas, $NH_3$ gas, or a combination thereof. Active species of hydrogen atoms H generated by the activation of the hydrogen ($H_2$) gas and/or the nitrogen-containing gas may go straight toward the substrate 102 in a vertical direction (Z direction) and penetrate into portions of the stopper insulating film P106, which are adjacent to the substrate 102 at the bottom of the trench region T1. Accordingly, incompletely bonded portions or unbonded portions of silicon nitride may be bonded in the portions of the stopper insulating film P106, which are adjacent to the substrate 102 at the bottom of the trench region T1, and thus, the stopper insulating film P106 may be uniformly densified.

Figure 11:
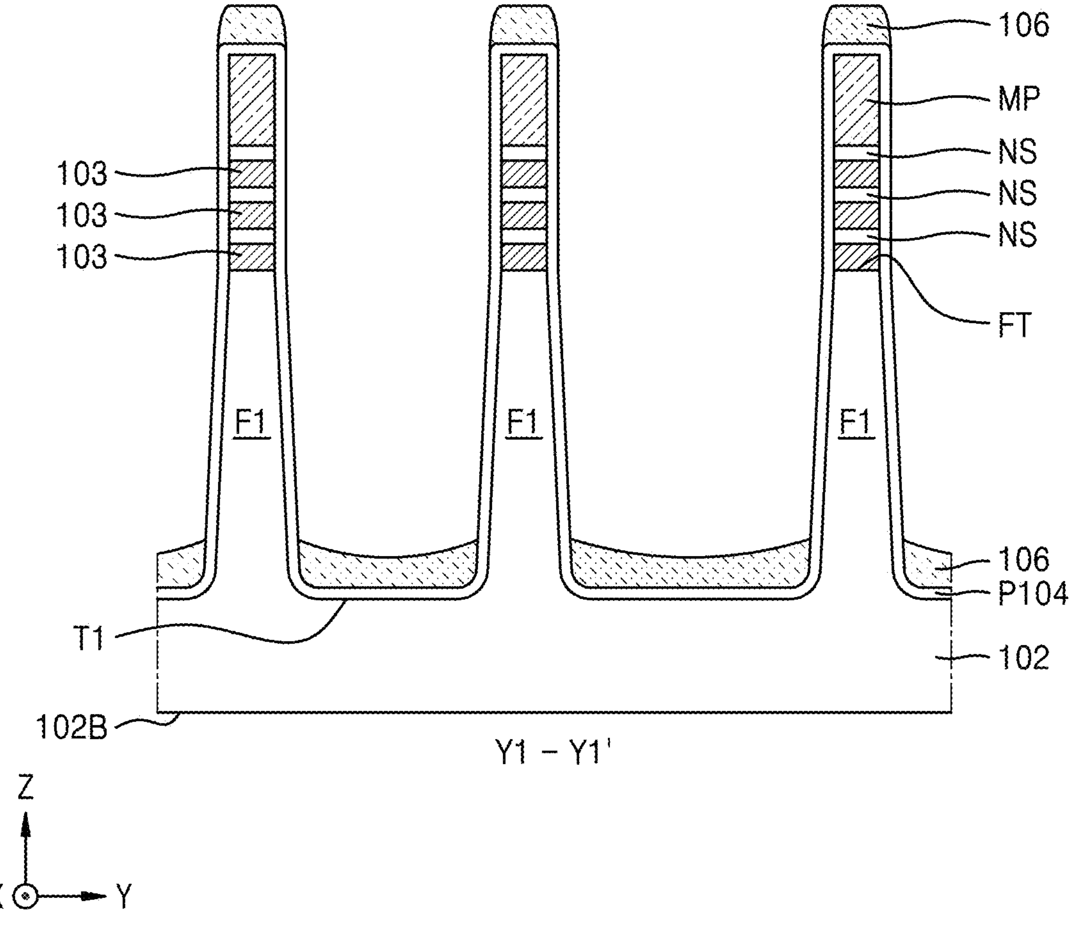

Referring to FIG. 11, a portion of the stopper insulating film P106 may be removed from the resultant structure of FIG. 10 by using a wet etching process to expose the semiconductor liner P104 covering the sidewall of each of the plurality of fin-type active regions F1, the plurality of sacrificial semiconductor layers 103, and the plurality of nanosheet semiconductor layers NS.

By using the wet etching process, portions of the stopper insulating film P106, which have relatively small thicknesses and relatively low densities on the sidewall of each of the plurality of fin-type active regions F1, may be removed first. As a result, some of portions of the stopper insulating film P106, which cover the substrate 102 at the bottom of the trench region T1 and have relatively great thicknesses, may be left as an insulating stopper 106. After the insulating stopper 106 is formed, a portion of the insulating stopper 106, which remains after the wet etching of the stopper insulating film P106, may also remain on a top surface of the mask pattern MP.

Figure 12:
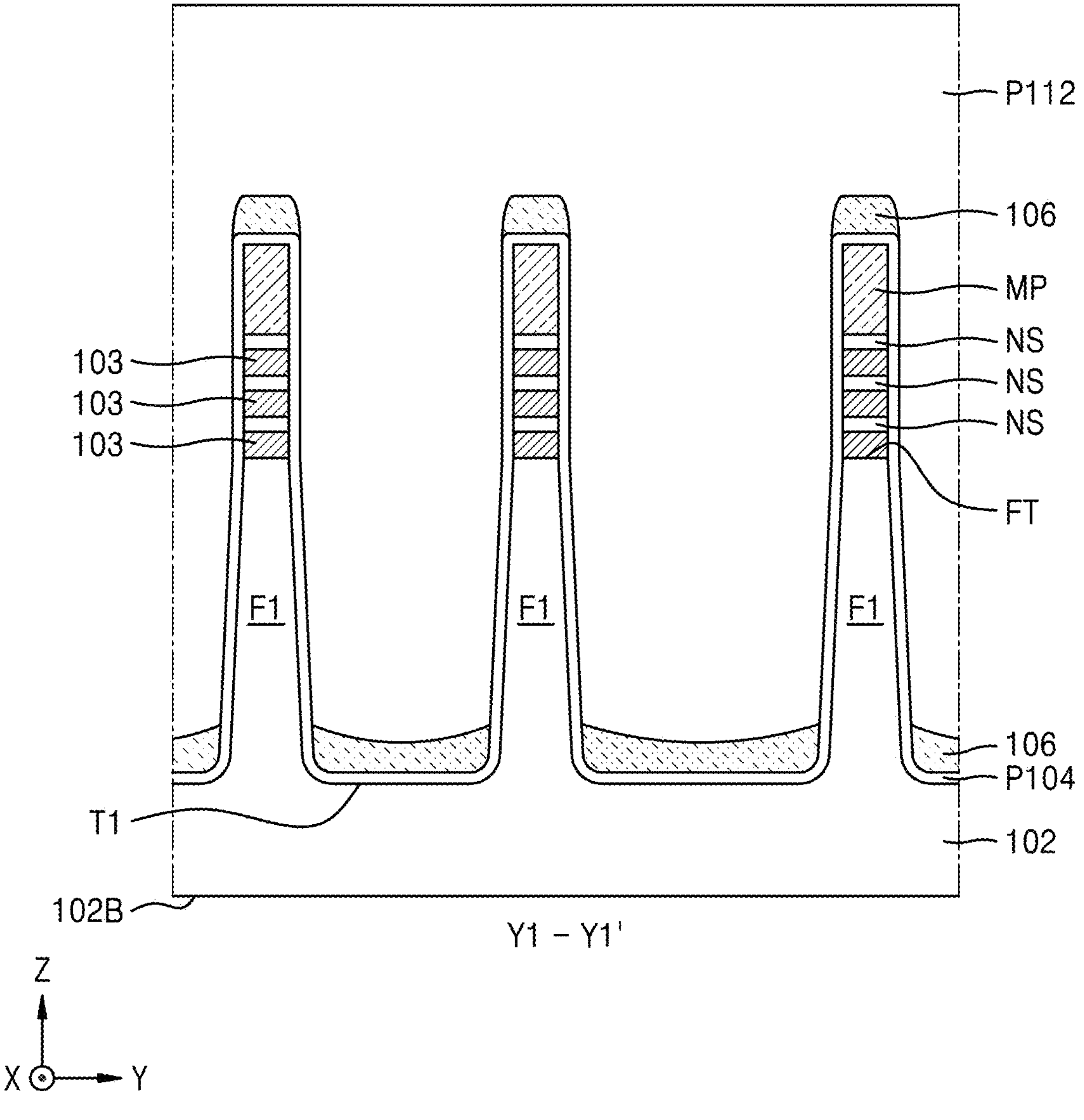

Referring to FIG. 12, a device isolation insulating film P112 may be formed on the resultant structure of FIG. 11. The device isolation insulating film P112 may be formed to a sufficient thickness to fill remaining spaces of the plurality of trench regions T1 over the insulating stopper 106. The device isolation insulating film P112 may include a silicon oxide film.

The device isolation insulating film P112 may be formed by using a plasma-enhanced chemical vapor deposition (PECVD) process, a high density plasma (HDP) CVD process, an inductively coupled plasma (ICP) CVD process, a capacitor coupled plasma (CCP) CVD process, a flowable CVD (FCVD) process, or a spin coating process. During the formation of the device isolation insulating film P112, the semiconductor liner P104 may prevent oxidation of the surface of each of the plurality of fin-type active regions F1, the plurality of sacrificial semiconductor layers 103, and the plurality of nanosheet semiconductor layers NS. After the device isolation insulating film P112 is formed, at least some of portions of the semiconductor liner P104, which are in contact with the device isolation insulating film P112, may be oxidized to form a silicon oxide film.

Figure 13A:
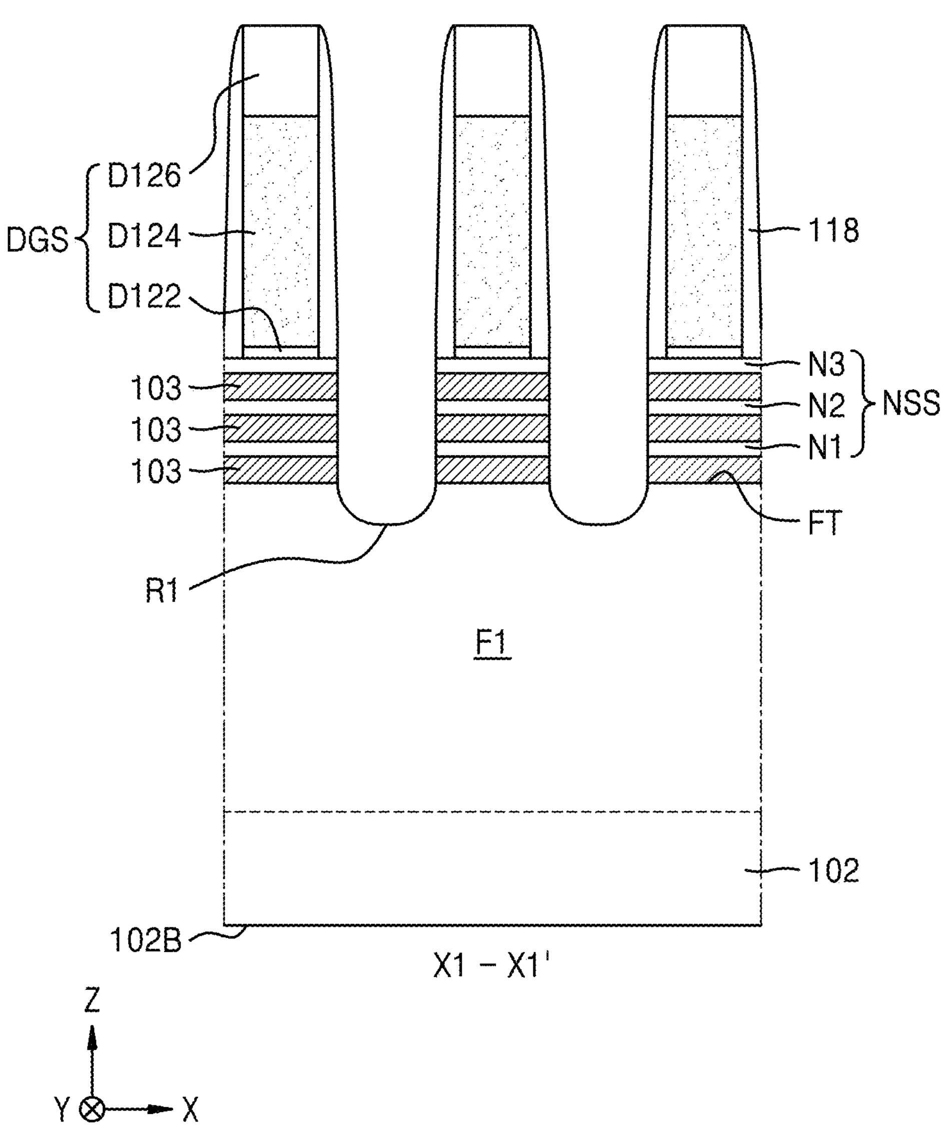
Figure 13B:
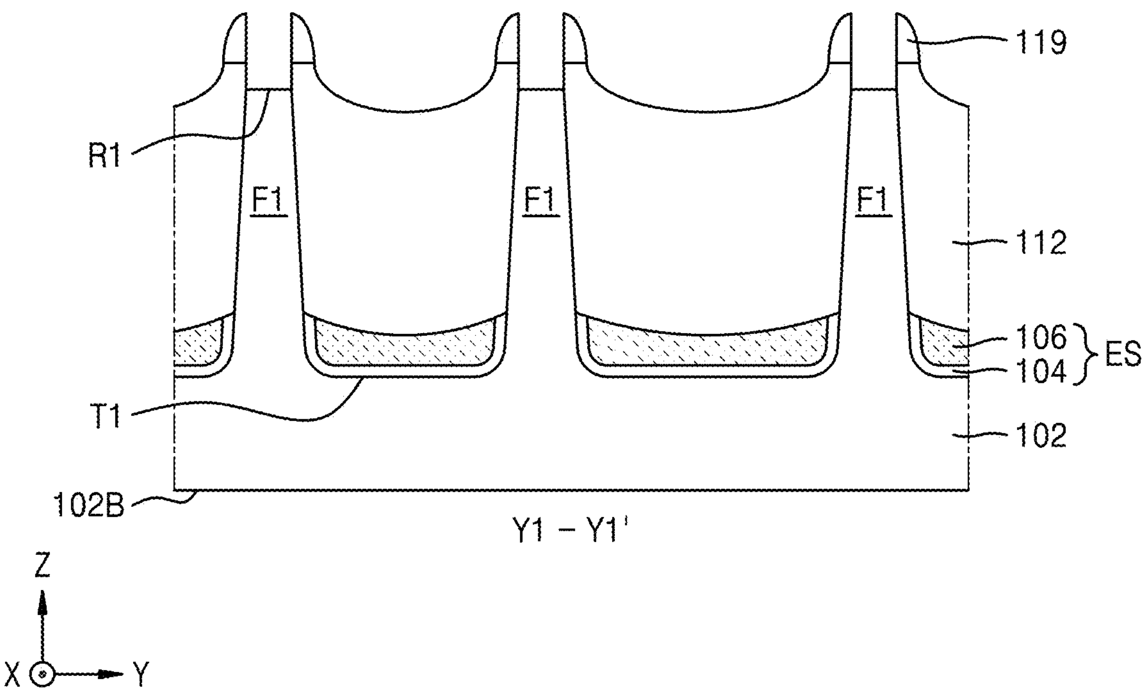
Figure 13C:
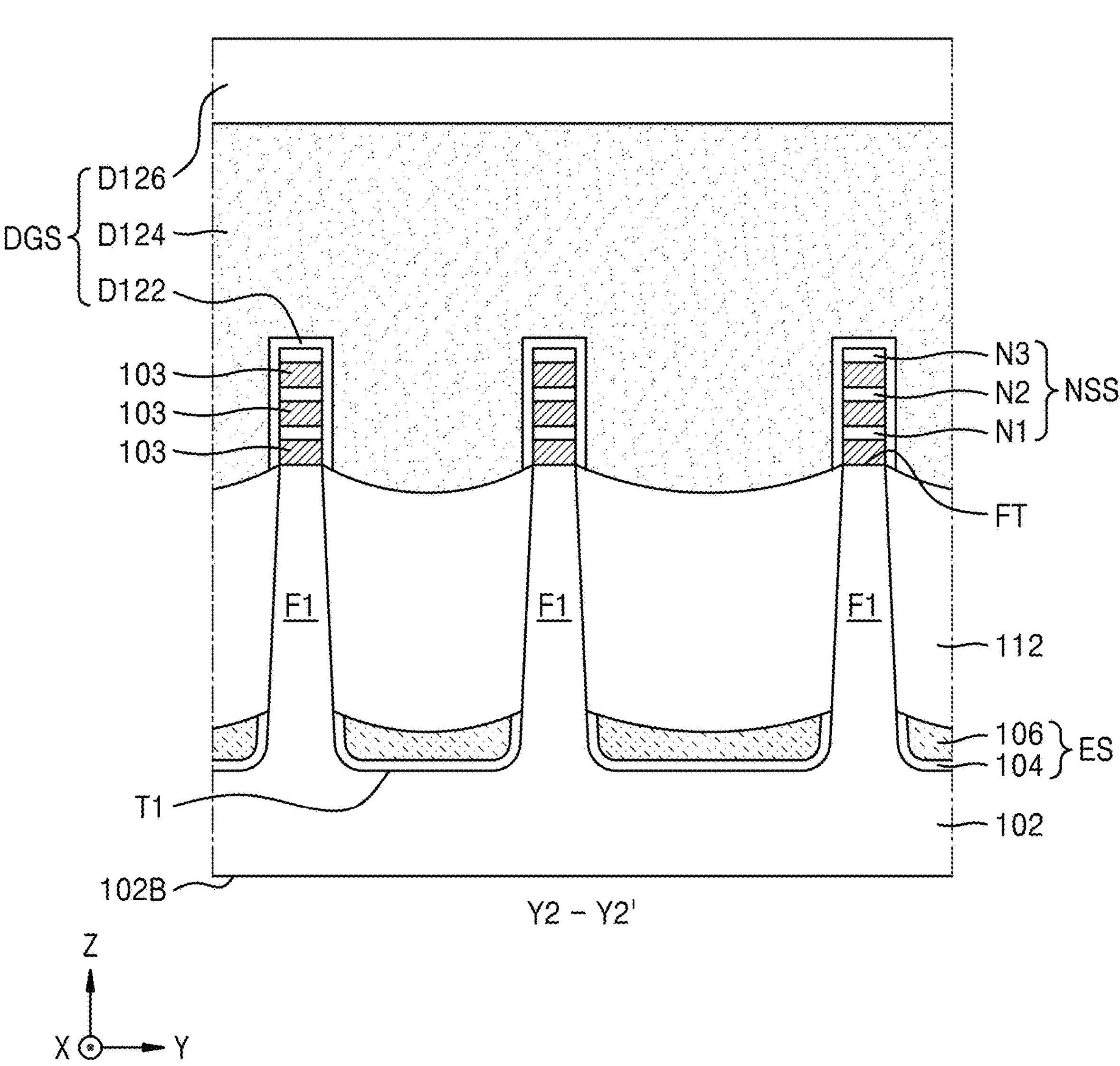

Referring to FIGS. 13A, 13B, and 13C, the resultant structure of FIG. 12 may be planarized to expose the top surface of the mask pattern MP. Thereafter, the mask pattern MP, which is exposed, may be removed, and a recess process for removing a portion of the device isolation insulating film P112 may be performed, and thus, a device isolation film 112 may be formed on the insulating stopper 106. As a result, the plurality of sacrificial semiconductor layers 103 and the plurality of nanosheet semiconductor layers (refer to NS in FIG. 12) may protrude over the top surface of the device isolation film 112.

The device isolation insulating film P112 may be recessed by using a dry etching process, a wet etching process, or a combination thereof. In this case, a wet etching process using $NH_4OH$, tetramethyl ammonium hydroxide (TMAH), or potassium hydroxide (KOH) as an etchant or a dry etching process, such as an inductively coupled plasma (ICP) process, a transformer coupled plasma (TCP) process, an electron cyclotron resonance (ECR) process, a reactive ion etch (RIE) process, may be employed. When the device isolation insulating film P112 is recessed by using a dry etching process, a fluorine-containing gas (e.g., $CF_4$), a chlorine-containing gas ($Cl_2$), or hydrogen bromide (HBr) may be used as an etch gas.

Of the semiconductor liner P104, portions that are between the respective sidewalls of the plurality of fin-type active regions F1 and the device isolation film 112 may be oxidized to form a portion of the device isolation film 112. Of the semiconductor liner P104, portions that are between the substrate 102 and the insulating stopper 106 and between the insulating stopper 106 and the fin-type active region F1 may be left as an insulating liner 104. The insulating liner 104 and the insulating stopper 106 may constitute an etch stop structure ES.

Thereafter, a plurality of dummy gate structures DGS may be formed on the stack structures of the plurality of sacrificial semiconductor layers 103 and the plurality of nanosheet semiconductor layers NS. Each of the plurality of dummy gate structures DGS may be formed to extend long in the second lateral direction (Y direction). Each of the plurality of dummy gate structures DGS may have a structure in which an oxide film D122, a dummy gate layer D124, and a capping layer D126 are sequentially stacked. In some example embodiments, the oxide film D122 may be a film obtained by oxidizing the surface of each of the plurality of sacrificial semiconductor layers 103 and the plurality of nanosheet semiconductor layers (refer to NS in FIG. 12). The dummy gate layer D124 may include polysilicon, and the capping layer D126 may include a silicon nitride film.

A plurality of outer insulating spacers 118 may be formed to cover both sidewalls of each of the plurality of dummy gate structures DGS. Thereafter, a portion of each of the plurality of sacrificial semiconductor layers 103 and the plurality of nanosheet semiconductor layers NS and a portion of the fin-type active region F1 may be etched by using the plurality of dummy gate structures DGS and the plurality of outer insulating spacers 118 as etch masks. Thus, the plurality of nanosheet semiconductor layers NS may be divided into a plurality of nanosheet stacks NSS, each of which includes a first nanosheet N1, a second nanosheet N2, and a third nanosheet N3, and a plurality of recesses R1 may be formed in an upper portion of the fin-type active region F1. To form the plurality of recesses R1, an etching process may be performed by using a dry etching process, a wet etching process, or a combination thereof. After the plurality of recesses R1 are formed, a plurality of recess-side insulating spacers 119 may be formed adjacent to the plurality of recesses R1 on the device isolation film 112 on both sides of each of the fin-type active region F1.

Figure 14:
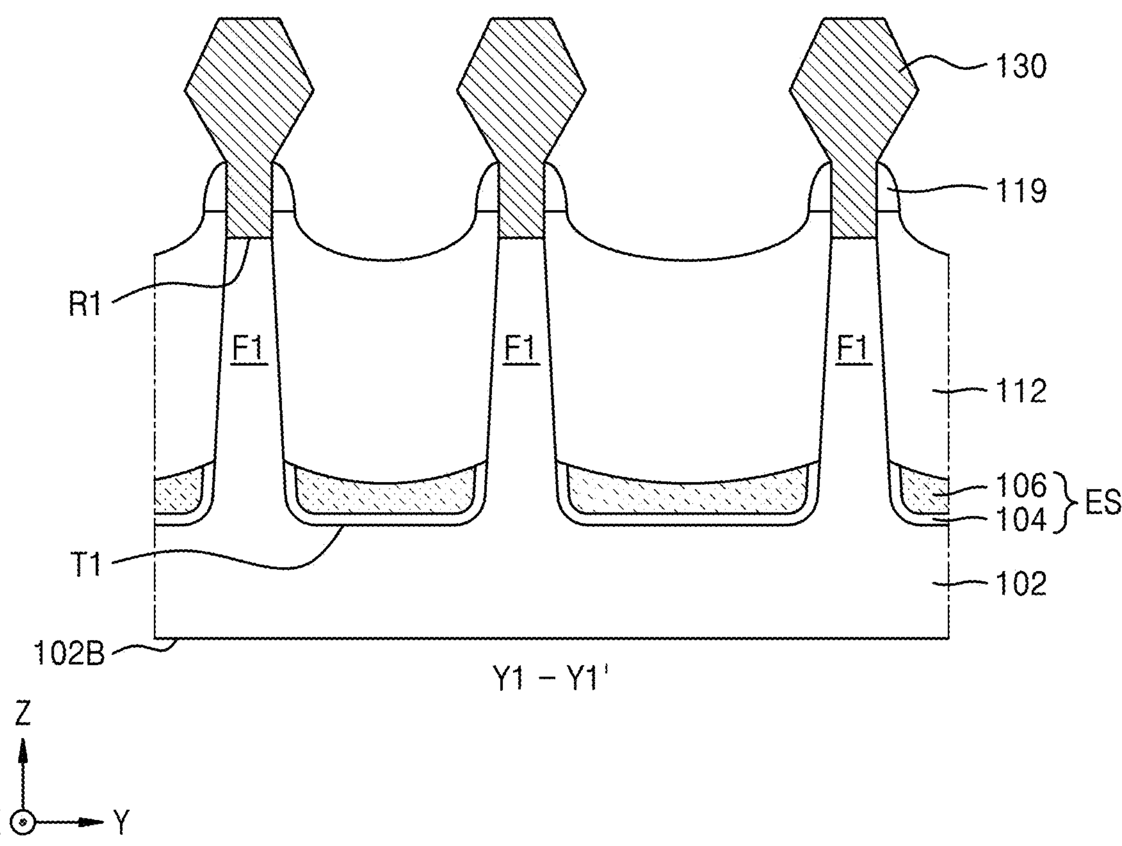

Referring to FIG. 14, in the resultant structure of FIGS. 13A, 13B, and 13C, a plurality of source/drain regions 130 may be formed to fill the plurality of recesses R1.

To form the plurality of source/drain regions 130, a semiconductor material may be epitaxially grown from a surface of the fin-type active region FA, which is exposed at a bottom surface of each of the plurality of recesses R1, and a sidewall of each of the first to third nanosheets N1, N2, and N3 included in the nanosheet stack NSS.

Figure 15A:
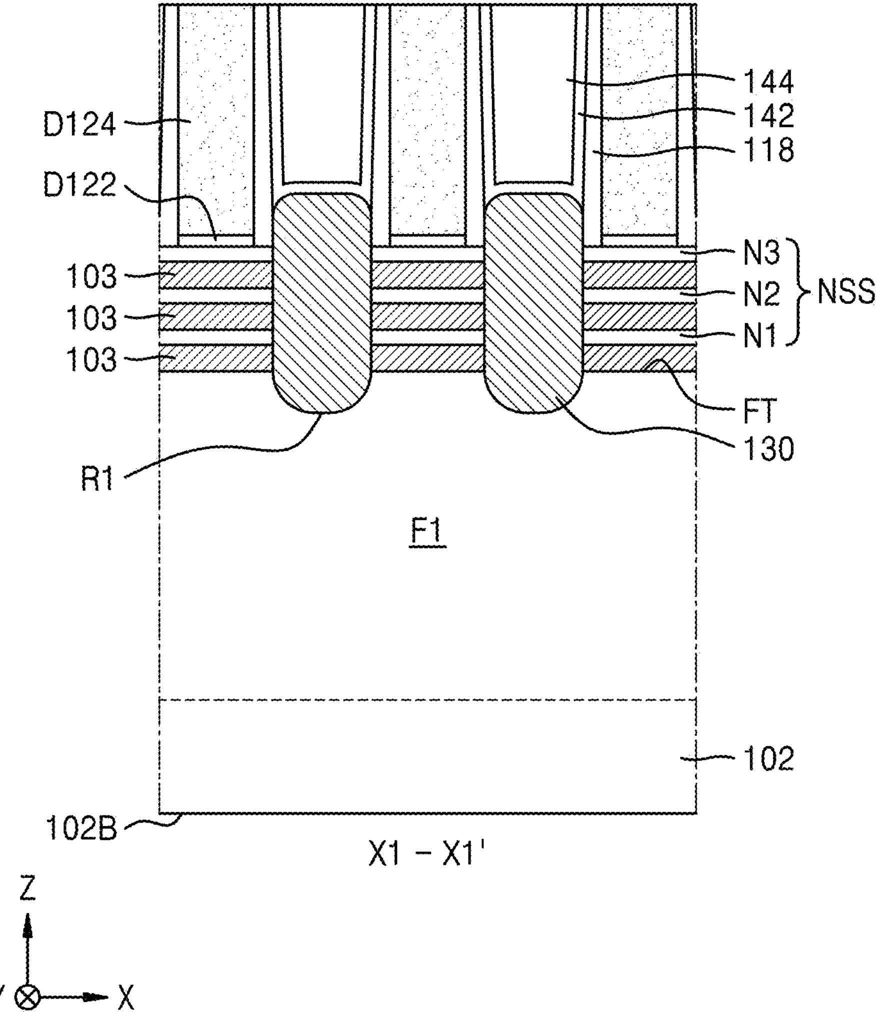
Figure 15B:
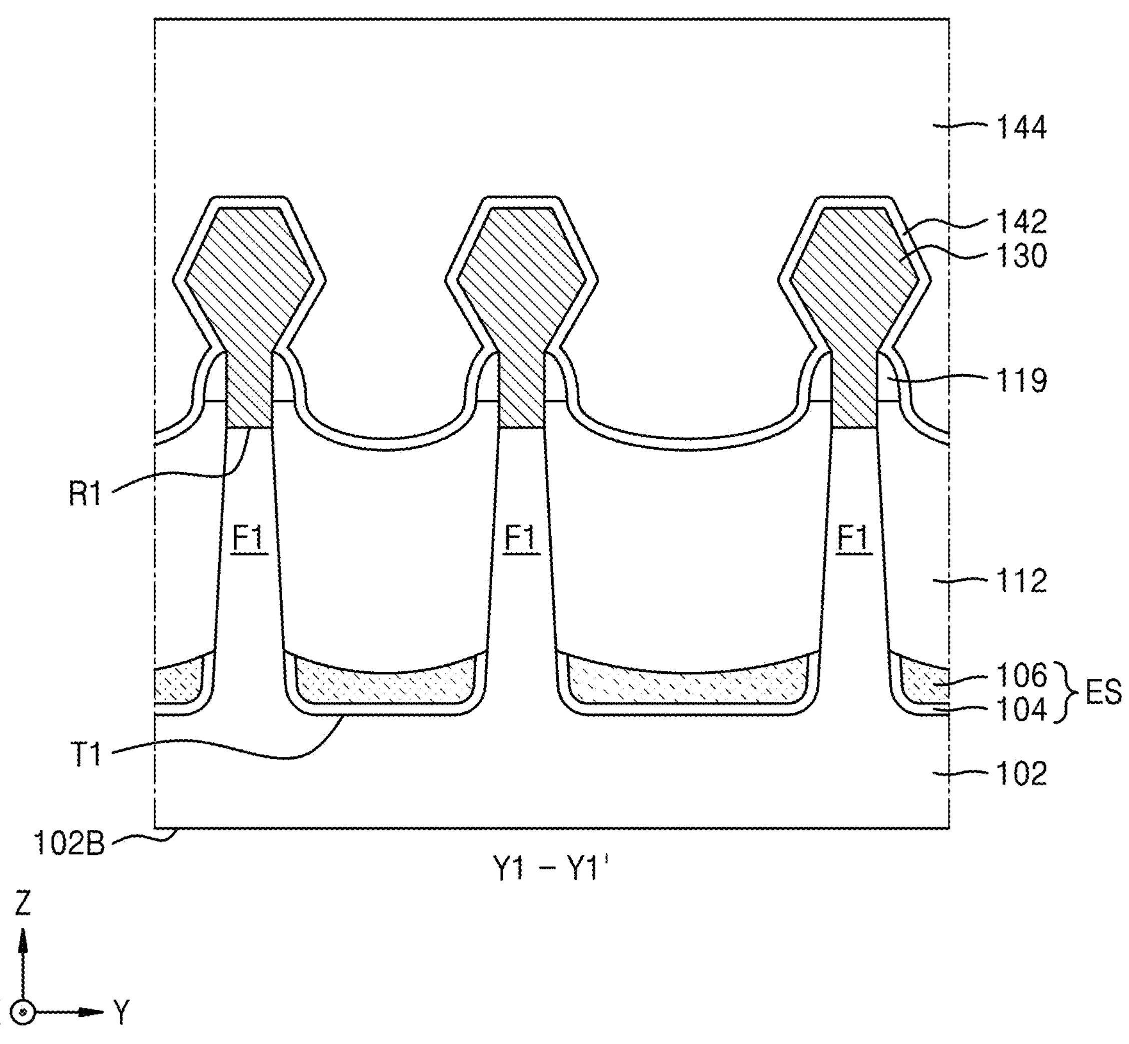
Figure 15C:
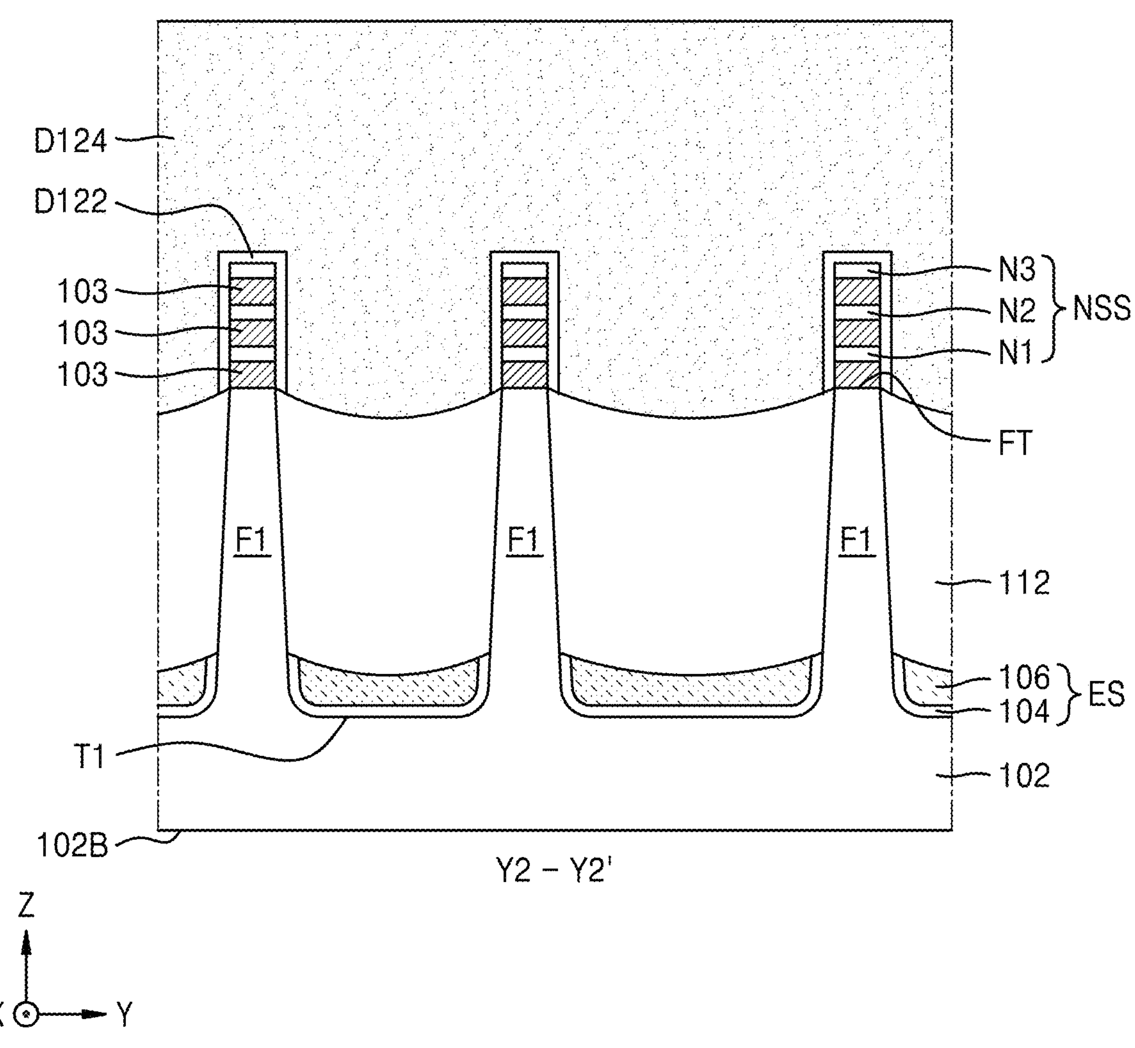

Referring to FIGS. 15A, 15B, and 15C, an insulating liner 142 may be formed to cover the resultant structure of FIG. 14, and an inter-gate dielectric film 144 may be formed on the insulating liner 142. Thereafter, a portion of each of the insulating liner 142 and the inter-gate dielectric film 144 may be etched to expose top surfaces of a plurality of capping layers D126. Thereafter, the dummy gate layer D124 may be exposed by removing the plurality of capping layers D126, and the insulating liner 142 and the inter-gate dielectric film 144 may be partially removed such that a top surface of the inter-gate dielectric film 144 and a top surface of the dummy gate layer D124 substantially become at the same level as each other.

Figure 16:
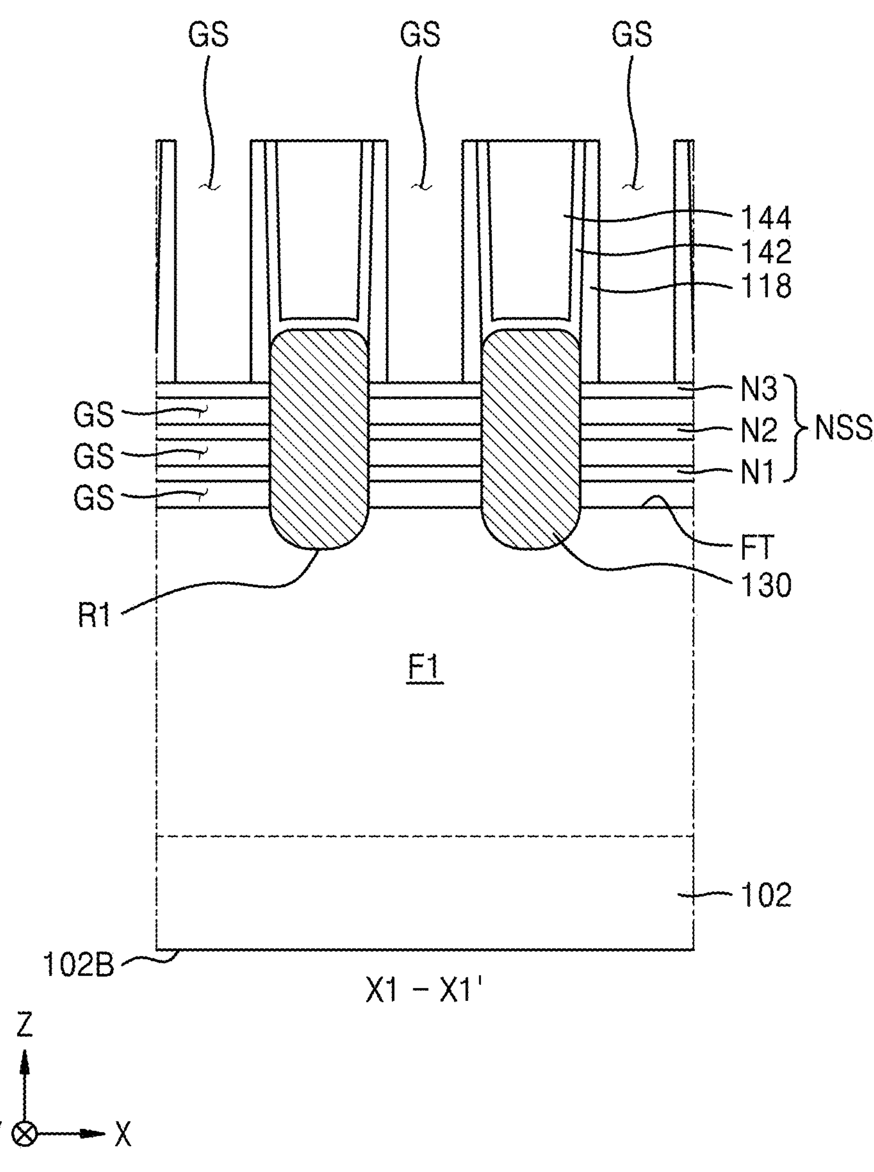

Referring to FIG. 16, a gate space GS may be prepared by removing the dummy gate layer D124 and the oxide film D122 located thereunder from the resultant structure of FIGS. 15A, 15B, and 15C, and the plurality of nanosheet stacks NSS may be exposed through the gate space GS. Afterwards, the plurality of sacrificial semiconductor layers 103 remaining on the fin-type active region FA may be removed through the gate space GS, and thus, the gate space GS may extend to respective spaces between the first to third nanosheets N1, N2, and N3 and a space between the first nanosheet N1 and the fin top surface FT of the fin-type active region FA. In some example embodiments, to selectively remove the plurality of sacrificial semiconductor layers 103, etch selectivities of the first to third nanosheets N1, N2, and N3 with respect to the plurality of sacrificial semiconductor layers 103 may be used.

A liquid or gaseous etchant may be used to selectively remove the plurality of sacrificial semiconductor layers 103. In some example embodiments, to selectively remove the plurality of sacrificial semiconductor layers 103, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Figure 17:
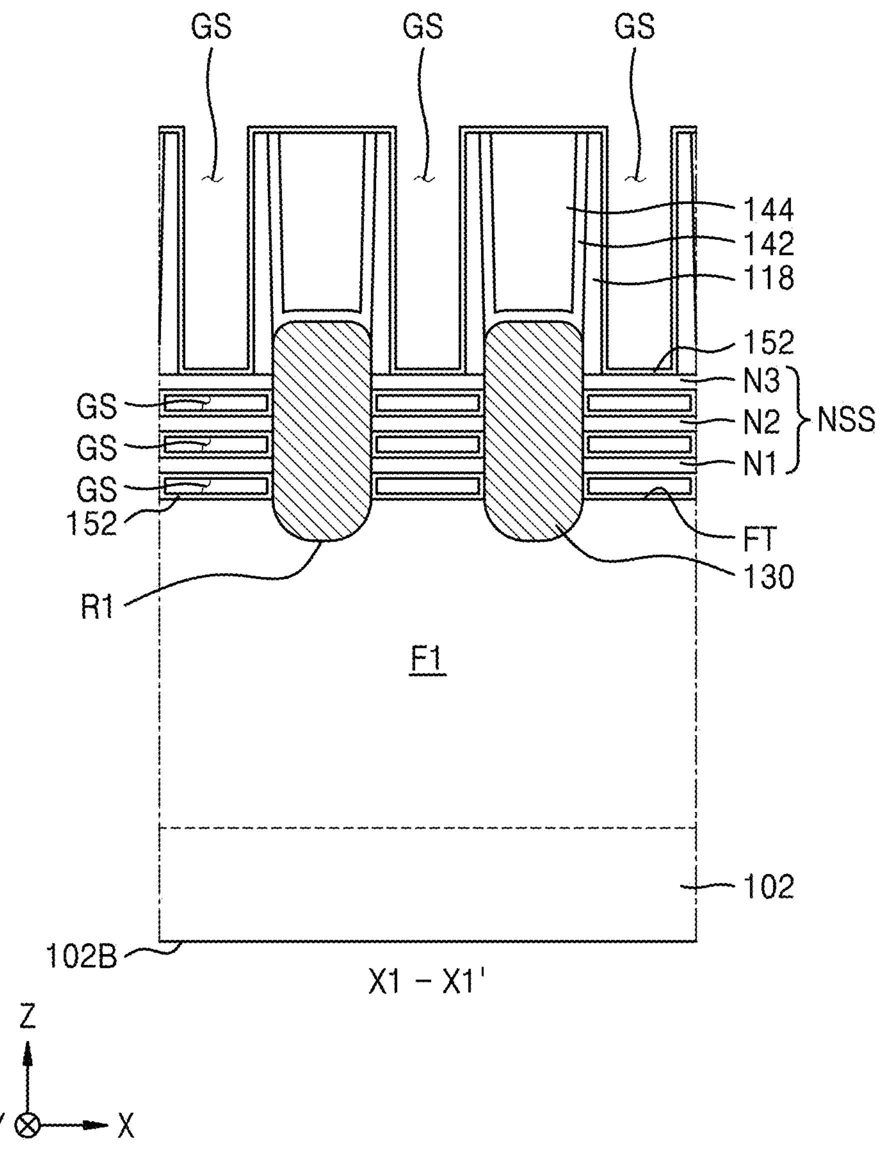

Referring to FIG. 17, in the resultant structure of FIG. 16, a gate dielectric film 152 may be formed to cover respective exposed surfaces of the first to third nanosheets N1, N2, and N3 and the fin-type active region FA. The gate dielectric film 152 may be formed by using an atomic layer deposition (ALD) process.

Figure 18:
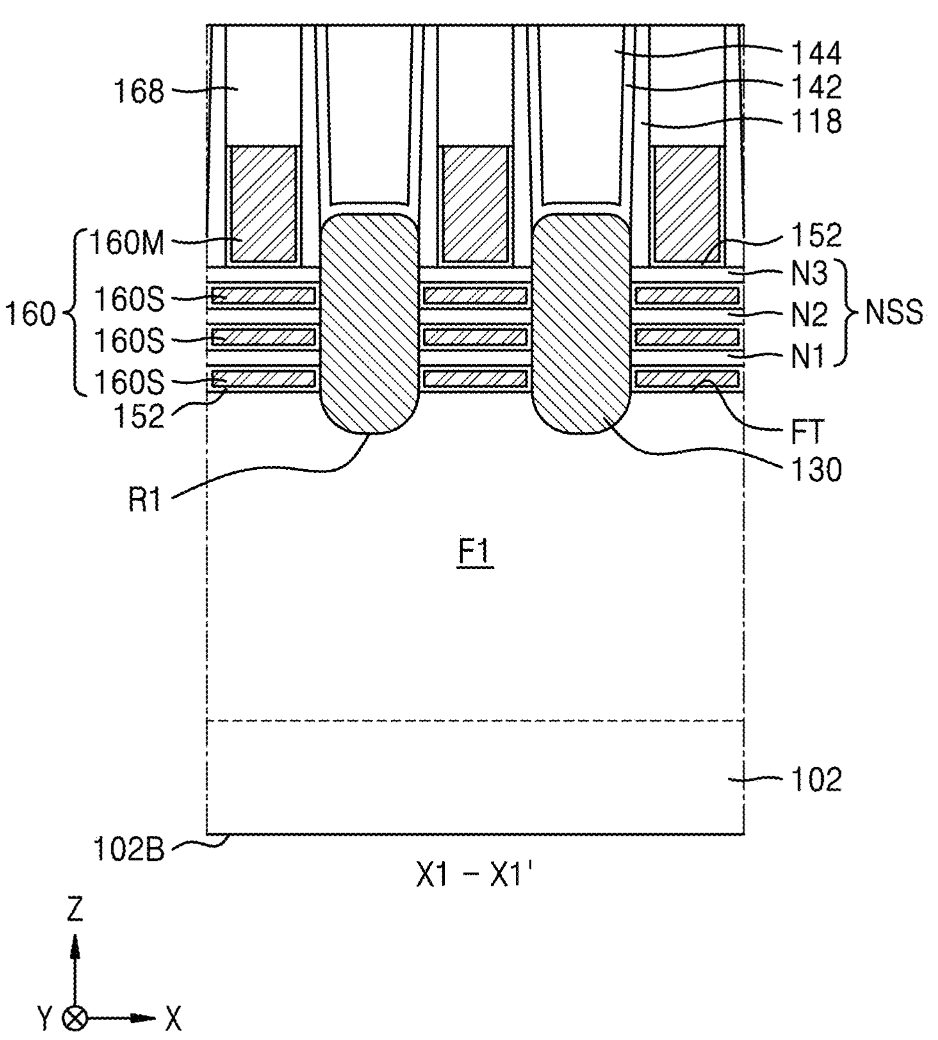

Referring to FIG. 18, a gate line 160 and a capping insulating pattern 168 may be formed. The gate line 160 may fill the gate space (refer to GS in FIG. 17) and cover the top surface of the inter-gate dielectric film 144 on the gate dielectric film 152. The capping insulating pattern 168 may cover a top surface of each of the gate line 160 and the gate dielectric film 152 in the gate space GS.

Figure 19A:
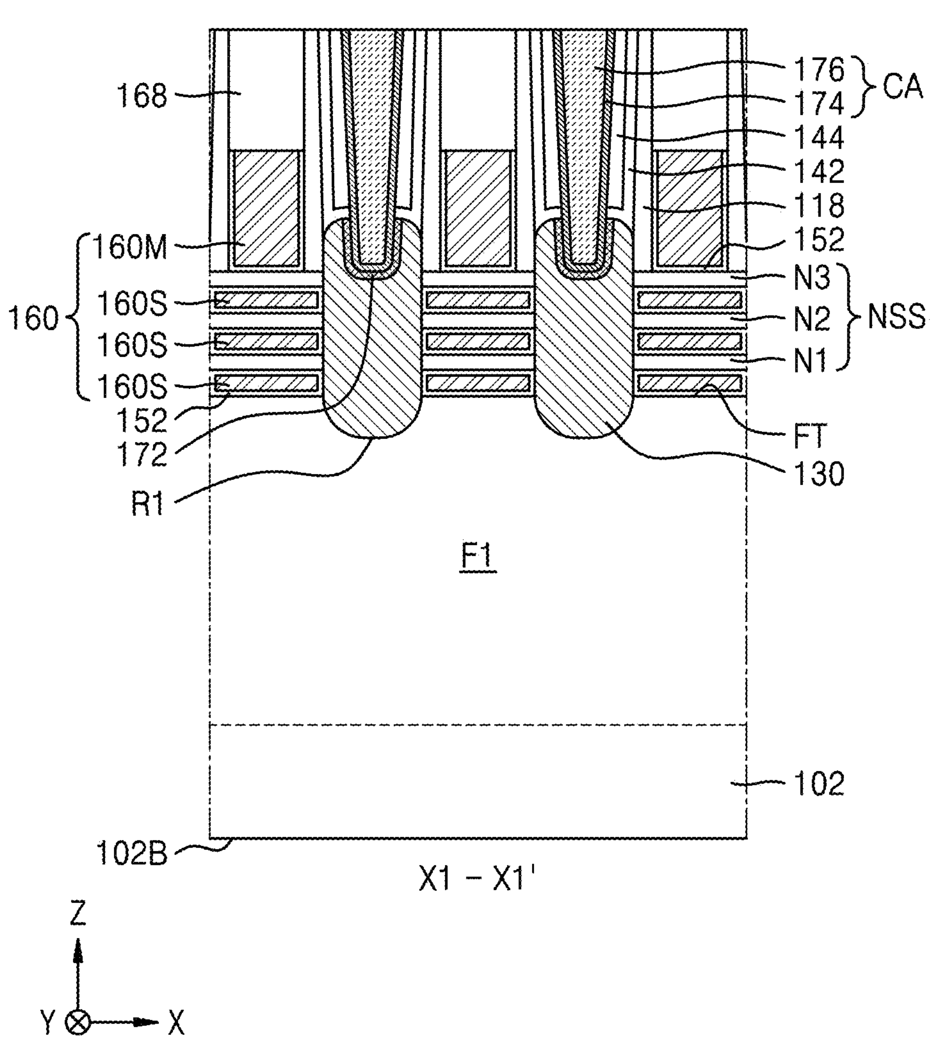
Figure 19B:
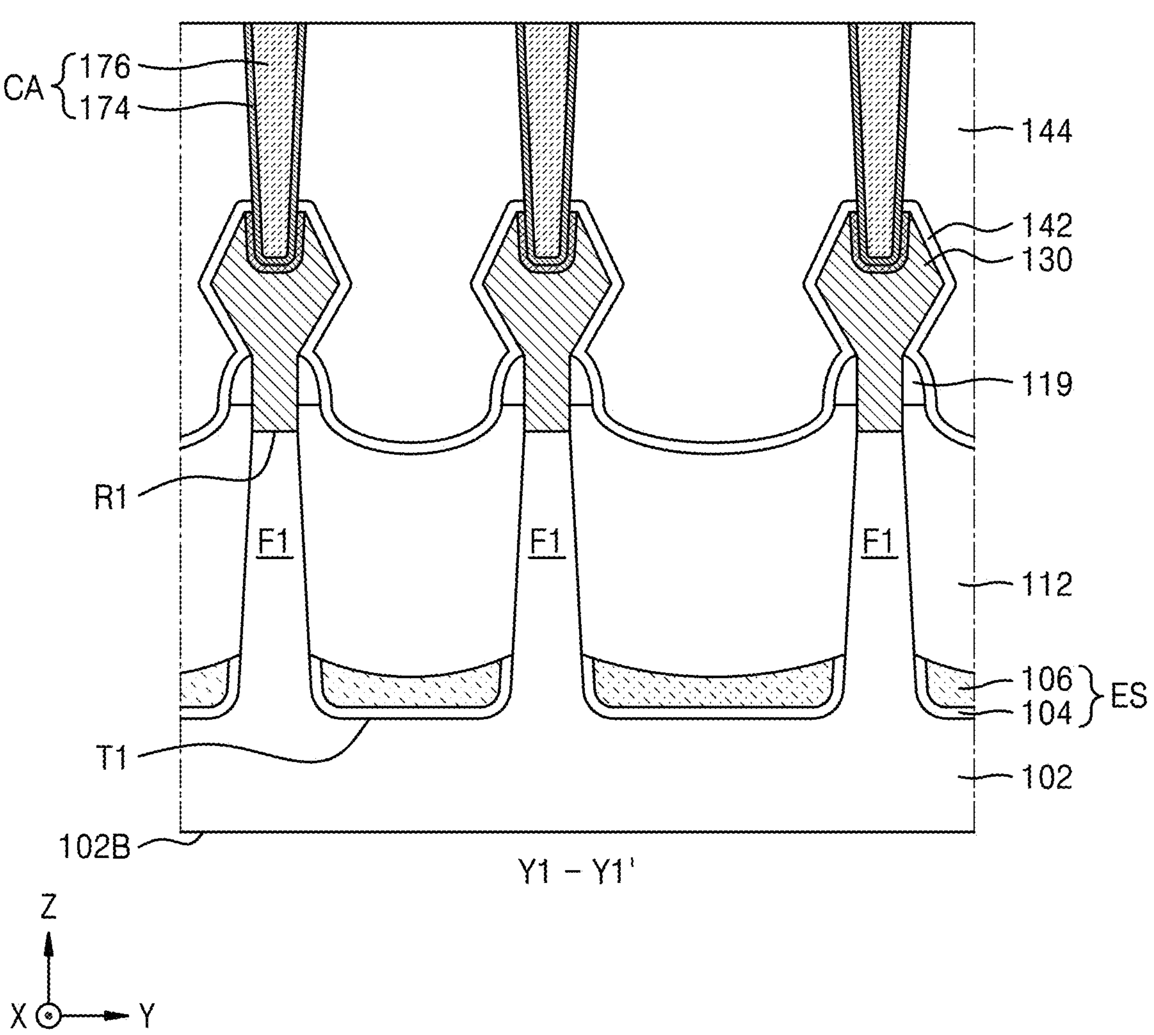
Figure 19C:
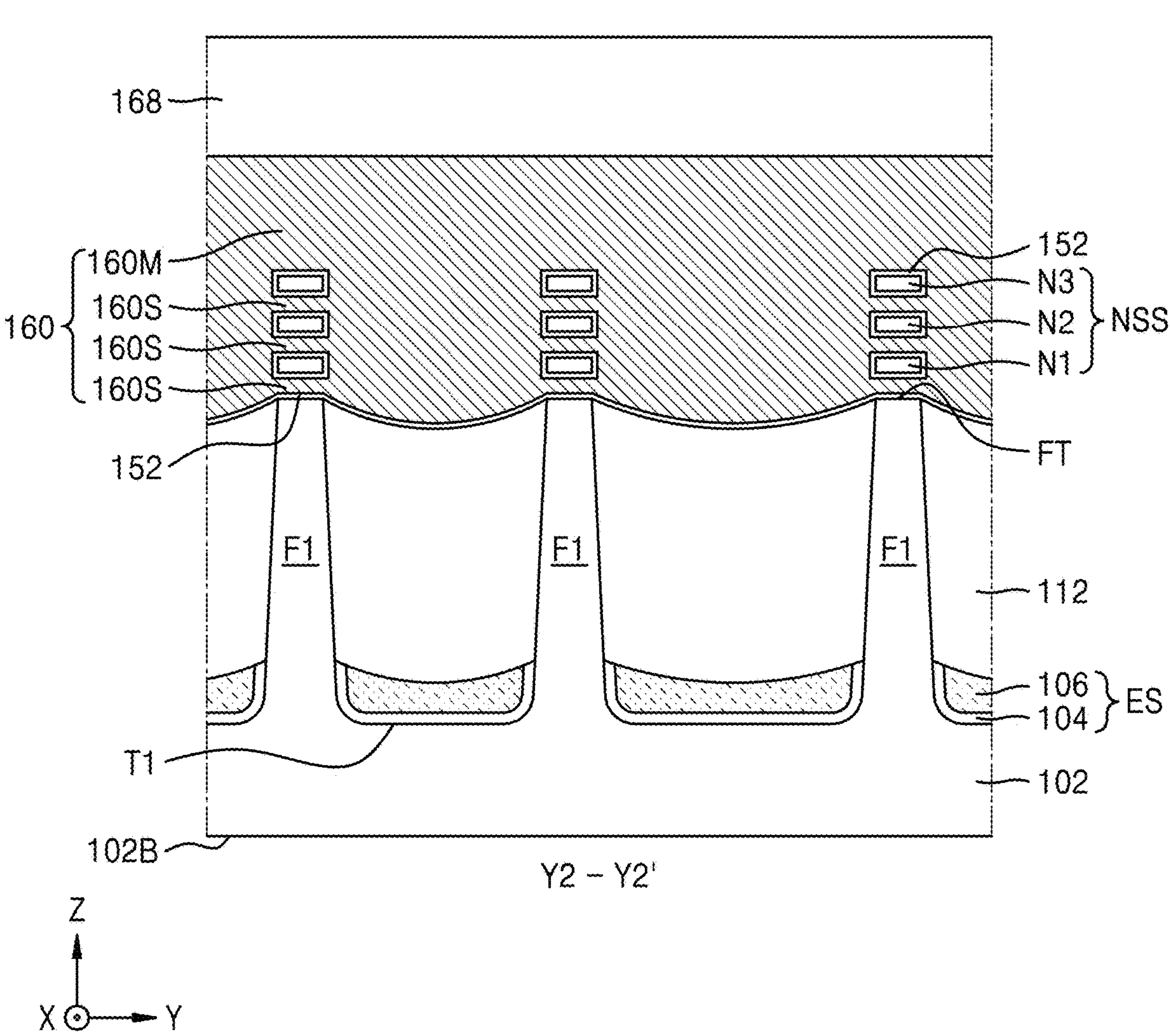

Referring to FIGS. 19A, 19B, and 19C, in the resultant structure of FIG. 18, a source/drain contact hole exposing the source/drain region 130 may be formed to pass through the insulating structure including the insulating liner 142 and the inter-gate dielectric film 144. Thereafter, a partial region of the source/drain region 130 may be removed by using an anisotropic etching process through the source/drain contact hole, and thus, the source/drain contact hole may extend in a longer manner toward the substrate 102. Afterwards, a metal silicide film 172 may be formed on the source/drain region 130 exposed at a bottom side of the source/drain contact hole. In some example embodiments, the formation of the metal silicide film 172 may include forming a metal liner (not shown) conformally covering the exposed surface of the source/drain region 130 and annealing the metal liner to induce a reaction of the source/drain region 130 with a metal included in the metal liner. After the metal silicide film 172 is formed, the remaining portion of the metal liner may be removed. A portion of the source/drain region 130 may be consumed during the formation of the metal silicide film 172. In some example embodiments, when the metal silicide film 172 includes a titanium silicide film, the metal liner may include a titanium (Ti) film.

Thereafter, a source/drain contact CA including a conductive barrier pattern 174 and a contact plug 176 may be formed on the metal silicide film 172.

Figure 20A:
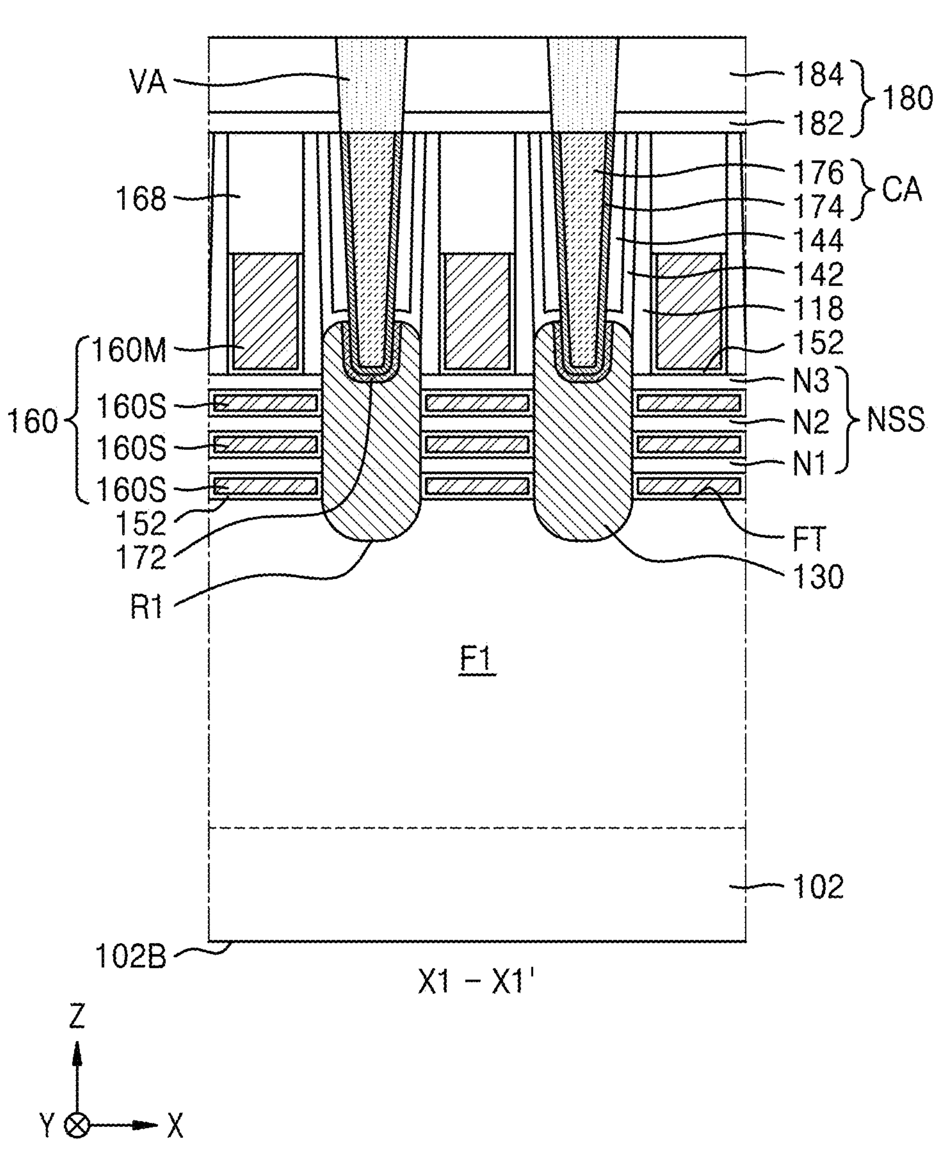
Figure 20B:
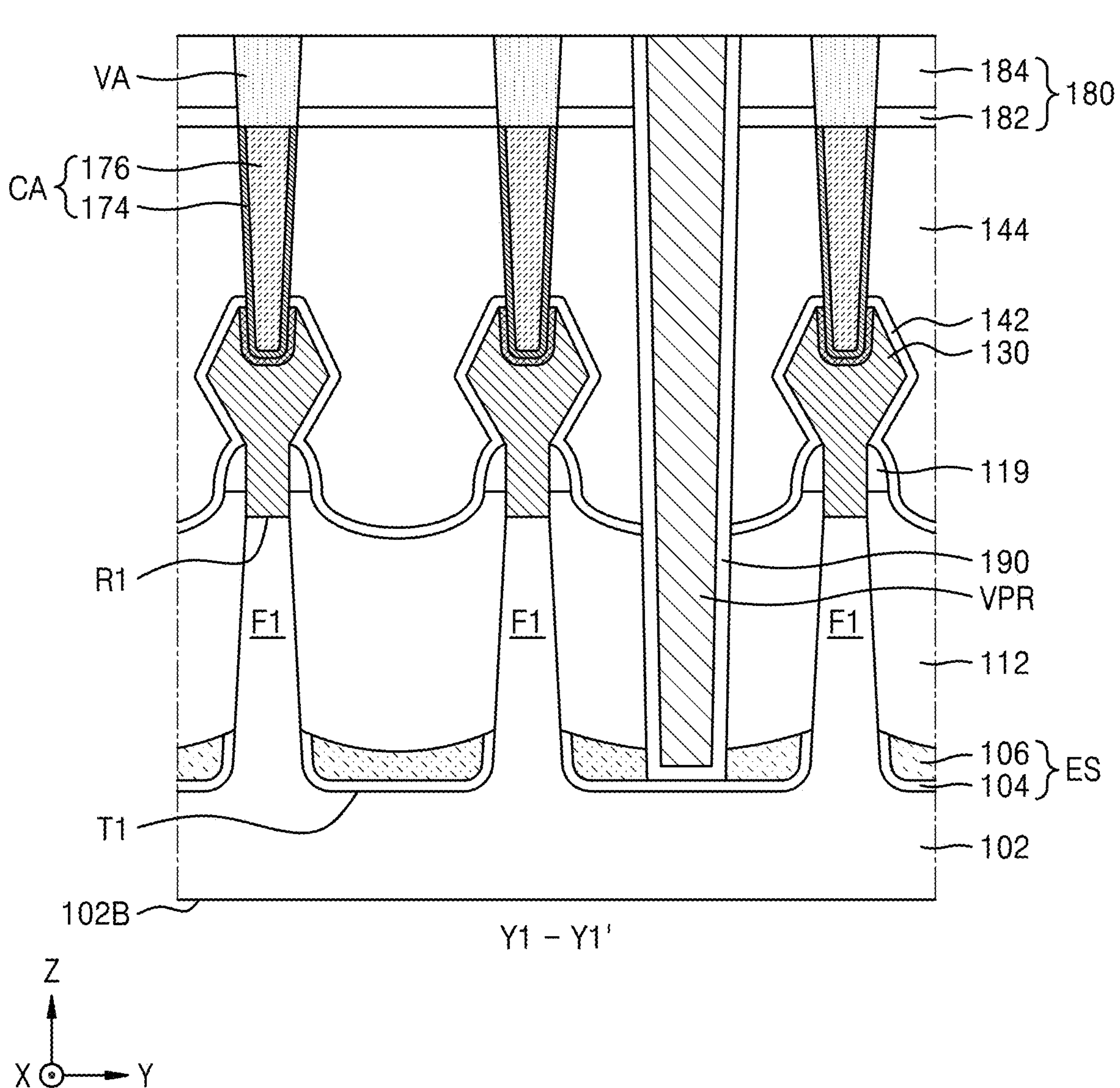
Figure 20C:
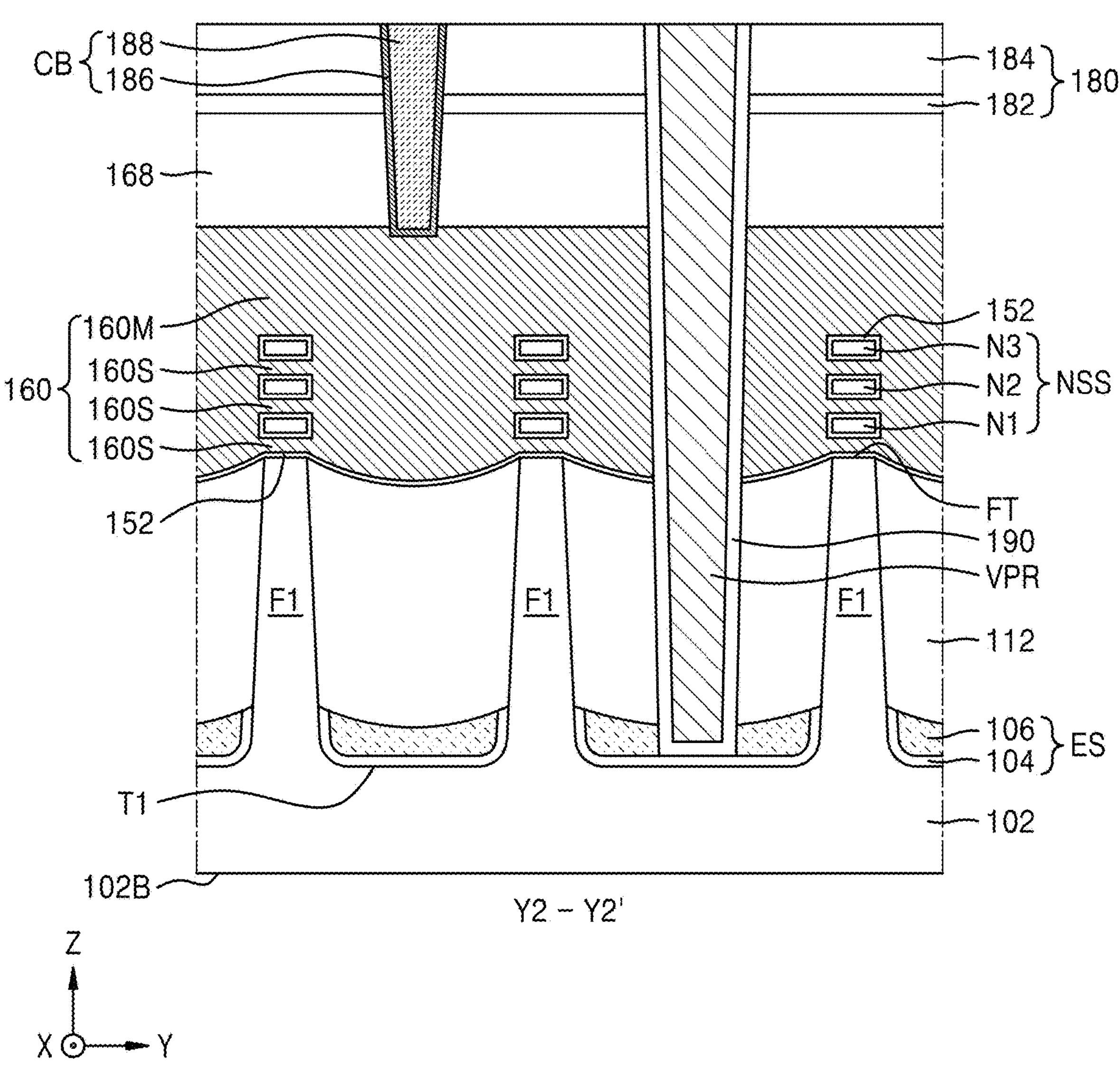

Referring to FIGS. 20A, 20B, and 20C, in the resultant structure of FIGS. 19A, 19B, and 19C, an etch stop film 182 and an interlayer insulating film 184 may be sequentially formed to cover a top surface of the inter-gate dielectric film 144, a top surface of each of a plurality of source/drain contacts CA, and a top surface of each of a plurality of capping insulating patterns 168, and thus, an upper insulating structure 180 may be formed.

Thereafter, a plurality of source/drain via contacts VA, a gate contact CB, and a via power rail structure may be formed. The plurality of source/drain via contacts VA may pass through the upper insulating structure 180 in a vertical direction (Z direction) and be connected to the plurality of source/drain contacts CA. The gate contact CB may pass through the upper insulating structure 180 and the capping insulating pattern 168 in the vertical direction (Z direction) and be connected to the gate line 160. The via power rail structure may include a via power rail VPR and an insulating spacer 190. The order of formation of the source/drain via contact VA, the gate contact CB, and the via power rail structure is not specifically limited.

To form the via power rail structure, it may be necessary to form a hole having a relatively great planar area, which passes through the upper insulating structure 180, the inter-gate dielectric film 144, the insulating liner 142, the gate line 160, the gate dielectric film 152, and the device isolation film 112 in the vertical direction (Z direction). In this case, by setting the etch stop structure ES as an etch stop point to form the hole, a completion point of the etching process may be precisely controlled.

Figure 21A:
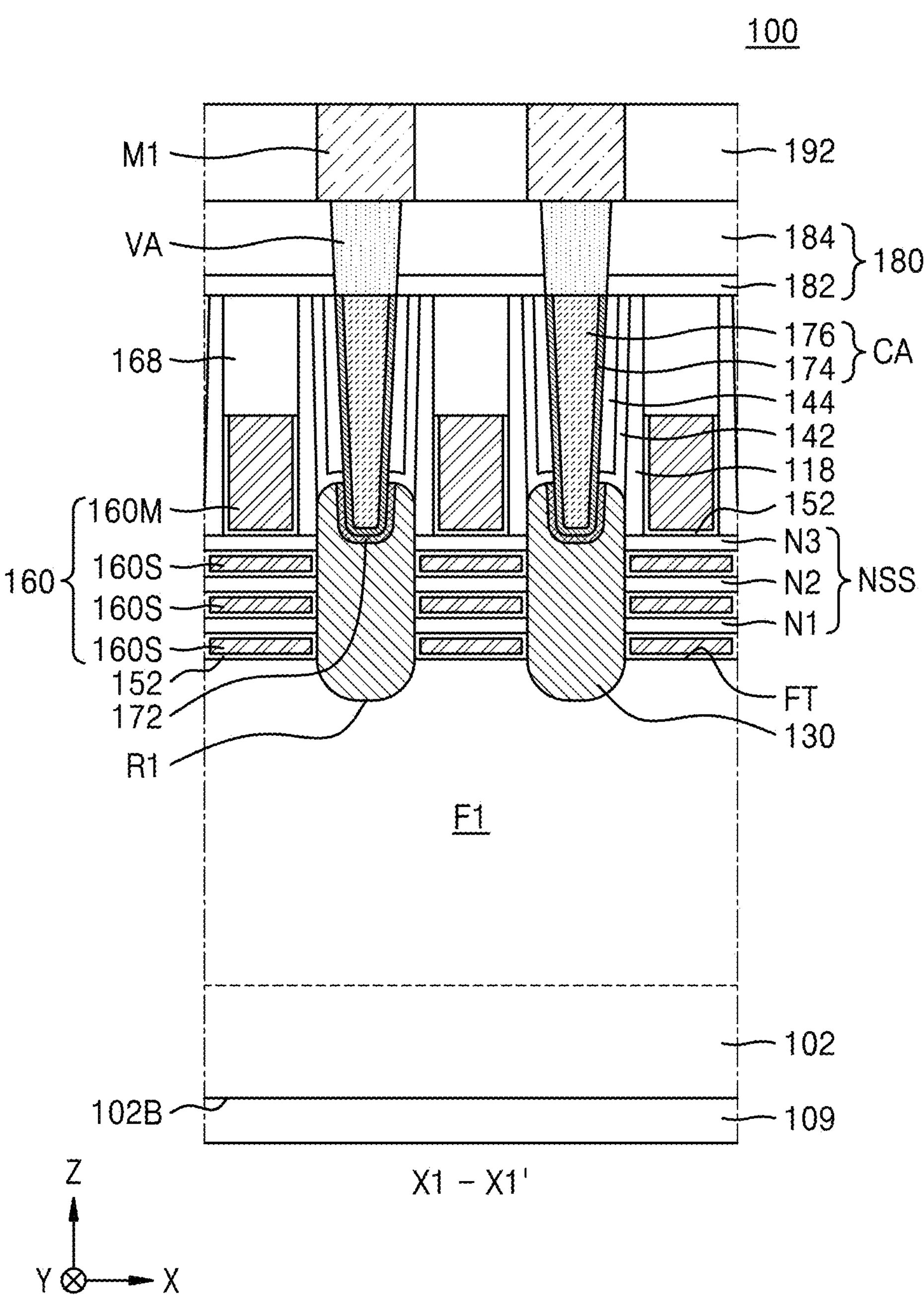
Figure 21B:
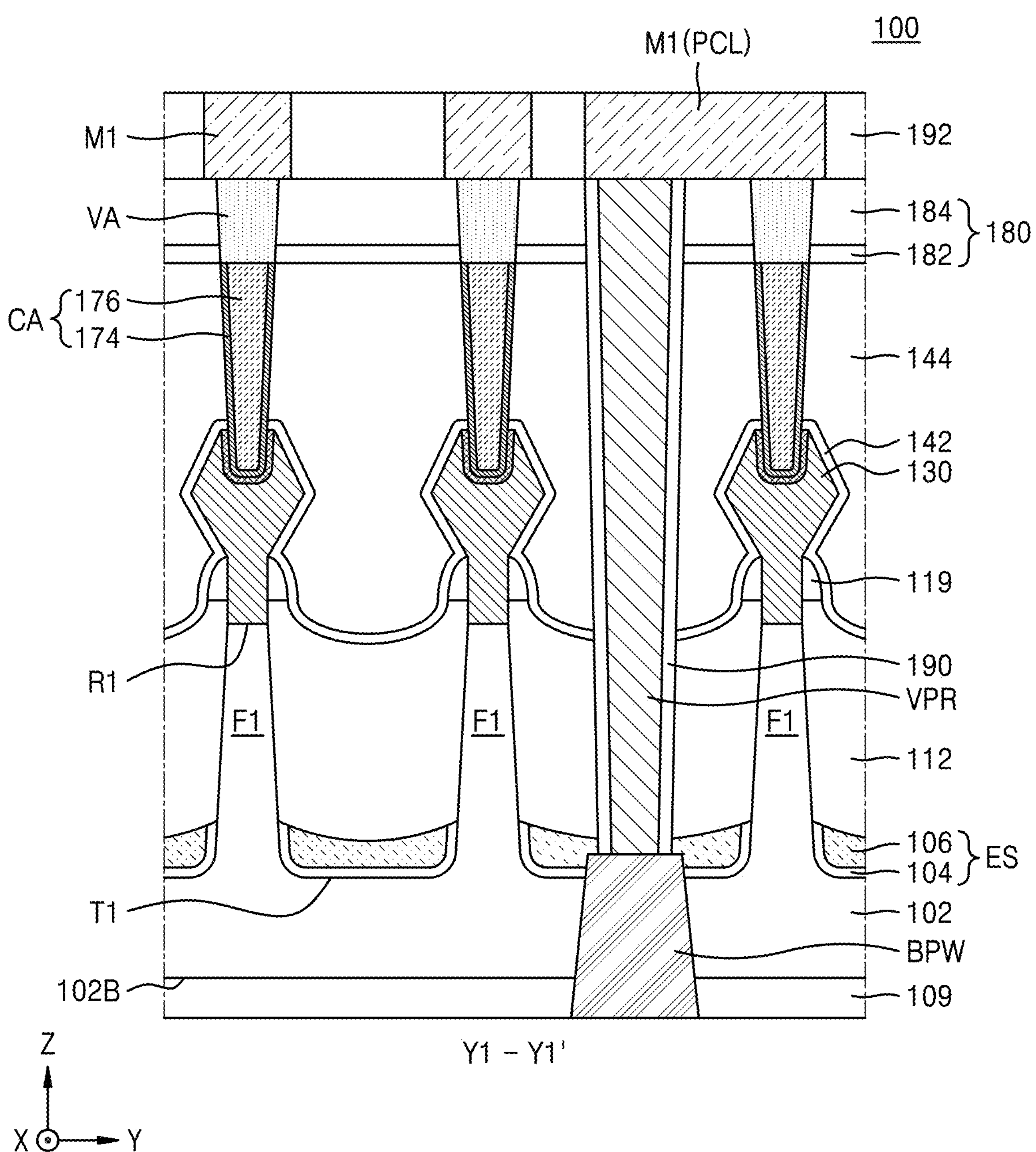
Figure 21C:
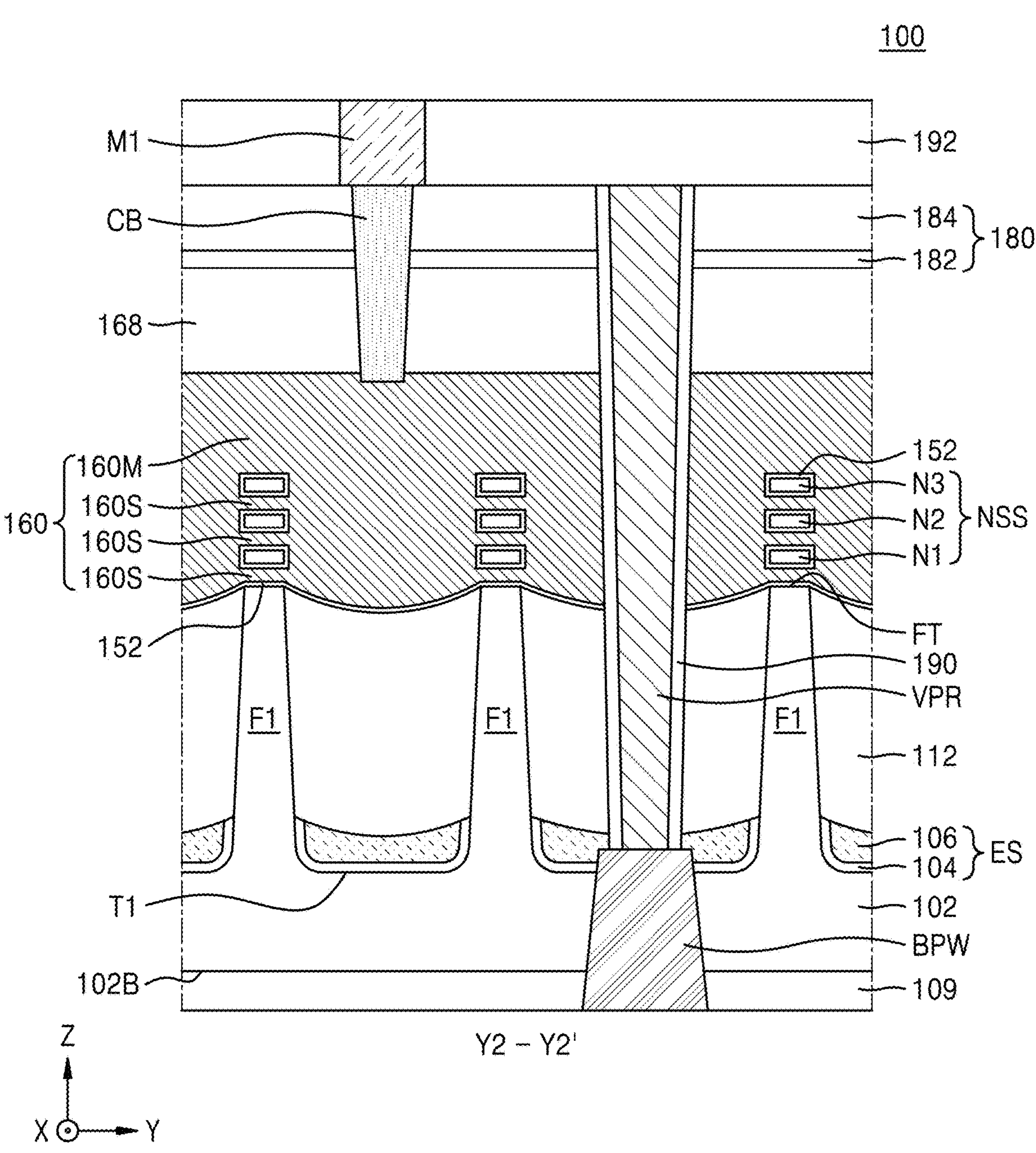

Referring to FIGS. 21A, 21B, and 21C, in the resultant structure of FIGS. 20A, 20B, and 20C, an upper insulating film 192 covering the upper insulating structure 180 may be formed, and a plurality of upper wiring layers M1 may be formed to pass through the upper insulating film 192 and be connected to the source/drain via contact VA, the gate contact CB, and the via power rail VPR. The plurality of upper wiring layers M1 may include a power connection conductive layer PCL connected to the via power rail VPR on the via power rail VPR.

A backside insulating film 109 may be formed to cover the back side surface 102B of the substrate 102, and a backside power rail BPW may be formed to pass through the backside insulating film 109 and the substrate 102 in the vertical direction (Z direction) and contact one end of the via power rail VPR. Accordingly, when an etching process for forming a hole passing through the backside insulating film 109 and the substrate 102 in the vertical direction (Z direction) is performed to form the backside power rail BPW, a completion point of the etching process may be precisely controlled by setting the etch stop structure ES as an etch stop point.

Although the method of manufacturing the IC device 100 illustrated in FIGS. 2 and 3A to 3D has been described with reference to FIGS. 8 to 21C, various modifications and changes may be made within the scope of the inventive concept to manufacture the IC devices 200, 300, 400, and 500 described above with reference to FIGS. 4 to 7 and IC devices variously modified and changed therefrom within the scope of the inventive concept.

For example, to manufacture the IC device 200 shown in FIG. 4, in the processes described with reference to FIGS. 13A, 13B, and 13C, an oxide pattern 208 may be formed by oxidizing partial regions of the semiconductor liner P104, which are adjacent to the device isolation film 112, during the formation of the device isolation film 112. To manufacture the IC device 300 shown in FIG. 5, in the processes described with reference to FIGS. 13A, 13B, and 13C, an insulating liner 308 may be formed by oxidizing at least a portion of the semiconductor liner P104 during the formation of the device isolation film 112.

While various example embodiments have been particularly shown and described with reference to some example embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures, and may also include one or more other features described with reference to one or more other figures.

What is claimed is:

1. An integrated circuit device comprising:

a substrate having a back side surface;

a pair of fin-type active regions protruding from the substrate to define a trench region on the substrate on an opposite side of the back side surface, the pair of fin-type active regions extending in a first lateral direction;

a pair of source/drain regions on the pair of fin-type active regions, respectively;

a device isolation film covering at least a portion of a sidewall of each of the pair of fin-type active regions in the trench region, the device isolation film apart from the substrate in a vertical direction;

an etch stop structure filling at least a portion of the trench region between the substrate and the device isolation film;

an inter-gate dielectric film on the device isolation film and surrounding the pair of source/drain regions;

a via power rail between the pair of fin-type active regions and between the pair of source/drain regions, the via power rail passing through at least a portion of the etch stop structure in the vertical direction; and a backside power rail passing through the substrate from the back side surface of the substrate in the vertical direction, the backside power rail in contact with one end of the via power rail.

2. The integrated circuit device of claim 1, wherein the via power rail passes through a portion of the etch stop structure in the vertical direction, the portion of the etch stop structure having a thickness less than a total thickness of the etch stop structure in the vertical direction, and the backside power rail passes through a remaining portion of the etch stop structure in the vertical direction, the remaining portion having a thickness less than the total thickness of the etch stop structure in the vertical direction.

3. The integrated circuit device of claim 1, wherein a vertical level of a contact surface between the via power rail and the backside power rail is between a bottom vertical level of the etch stop structure that is closest to the back side surface of the substrate and a top vertical level of the etch stop structure that is farthest from the back side surface of the substrate.

4. The integrated circuit device of claim 1, further comprising:

a gate line extending in a second lateral direction over the pair of fin-type active regions, the second lateral direction intersecting the first lateral direction, wherein the via power rail passes through the gate line in the vertical direction.

5. The integrated circuit device of claim 1, wherein the etch stop structure comprises:

an insulating liner in contact with the substrate; and an insulating stopper having a top surface in contact with the device isolation film and a bottom surface and a sidewall that are surrounded by the insulating liner.

6. The integrated circuit device of claim 1, wherein the etch stop structure comprises:

an insulating liner in contact with the substrate;

an insulating stopper having a bottom surface surrounded by the insulating liner; and an oxide pattern between the insulating stopper and one fin-type active region selected from the pair of fin-type active regions, the oxide pattern having a bottom surface in contact with the insulating liner and a top surface in contact with the device isolation film.

7. The integrated circuit device of claim 1, wherein the etch stop structure comprises:

an insulating liner in contact with the substrate; and an insulating stopper having a bottom surface and a sidewall that are surrounded by the insulating liner, wherein at least a portion of the insulating liner comprises a silicon oxide film, and an oxygen atom concentration of the insulating liner increases toward the device isolation film, and the insulating stopper comprises a silicon nitride film.

8. The integrated circuit device of claim 1, wherein the etch stop structure comprises:

an insulating liner in contact with the substrate; and an insulating stopper having a bottom surface and a sidewall that are surrounded by the insulating liner, wherein the one end of the via power rail, which is in contact with the backside power rail, is apart from the insulating liner, and the backside power rail passes through the insulating liner in the vertical direction.

9. The integrated circuit device of claim 1, further comprising:

a source/drain contact apart from the via power rail in a second lateral direction, the source/drain contact being connected to one selected source/drain region selected from the pair of source/drain regions, the source/drain contact on the one selected source/drain region, the second lateral direction intersecting the first lateral direction;

a power connection conductive layer on the via power rail and connected to the via power rail; and a source/drain via contact apart from the via power rail in the second lateral direction, the source/drain via contact connected between the source/drain contact and the power connection conductive layer.

10. The integrated circuit device of claim 1, further comprising:

a source/drain contact on one selected source/drain region selected from the pair of source/drain regions, the source/drain contact connected between the one selected source/drain region and the via power rail.

11. The integrated circuit device of claim 1, further comprising:

a source/drain contact apart from the via power rail in a second lateral direction, the source/drain contact connected to one selected source/drain region selected from the pair of source/drain regions, the source/drain contact on the one selected source/drain region, the second lateral direction intersecting the first lateral direction; and a power connection via on the source/drain contact and connected between the source/drain contact and the via power rail.

12. The integrated circuit device of claim 1, further comprising:

a gate line extending in a second lateral direction over the pair of fin-type active regions, the second lateral direction intersecting the first lateral direction; and a pair of nanosheet stacks between the pair of fin-type active regions and the gate line, each nanosheet stack comprising at least one nanosheet surrounded by the gate line, wherein in the vertical direction the via power rail passes through the gate line between the pair of nanosheet stacks.

13. The integrated circuit device of claim 1, further comprising:

a gate line extending in a second lateral direction over the pair of fin-type active regions, the second lateral direction intersecting the first lateral direction; and a pair of nanosheet stacks between the pair of fin-type active regions and the gate line, each nanosheet stack comprising at least one nanosheet surrounded by the gate line, wherein in the vertical direction the etch stop structure comprises a portion overlapping the gate line.

14. An integrated circuit device comprising:

a substrate having a back side surface;

a plurality of fin-type active regions protruding from the substrate to define a plurality of trench regions in the substrate on an opposite side of the back side surface, the plurality of fin-type active regions extending in a first lateral direction;

a plurality of source/drain regions on the plurality of fin-type active regions, respectively;

a device isolation film covering a portion of a sidewall of each of the plurality of fin-type active regions in the plurality of trench regions, the device isolation film apart from the substrate in a vertical direction;

an inter-gate dielectric film on the device isolation film and surrounding the plurality of source/drain regions;

a plurality of etch stop structures between the substrate and the device isolation film at bottoms of the plurality of trench regions, respectively;

a via power rail apart from the plurality of fin-type active regions and the plurality of source/drain regions in a lateral direction, in the vertical direction the via power rail passing through a portion of one selected etch stop structure selected from the plurality of etch stop structures; and a backside power rail passing from the back side surface of the substrate through the substrate in the vertical direction and passing through another portion of the one selected etch stop structure in the vertical direction, the backside power rail being in contact with one end of the via power rail.

15. The integrated circuit device of claim 14, wherein the plurality of etch stop structures comprises:

an insulating liner in contact with the substrate; and an insulating stopper having a bottom surface and a sidewall that are surrounded by the insulating liner and a top surface in contact with the device isolation film, wherein at least a portion of the insulating liner comprises a crystalline silicon (Si) film, an amorphous silicon film, an undoped silicon film, or a combination thereof, and the insulating stopper comprises a silicon nitride film.

16. The integrated circuit device of claim 14, wherein the plurality of etch stop structures comprises:

an insulating liner in contact with each of the substrate and a sidewall of one selected fin-type active region selected from the plurality of fin-type active regions;

an insulating stopper having a bottom surface surrounded by the insulating liner; and an oxide pattern between the insulating stopper and the one selected fin-type active region, the oxide pattern having a bottom surface in contact with the insulating liner and a top surface in contact with the device isolation film, wherein each of the insulating liner and the oxide pattern comprises a silicon (Si)-containing film, and a silicon concentration of the insulating liner is greater than a silicon concentration of the oxide pattern.

17. The integrated circuit device of claim 14, wherein the plurality of etch stop structures comprises:

an insulating liner in contact with the substrate; and an insulating stopper having a bottom surface and a sidewall that are surrounded by the insulating liner, wherein at least a portion of the insulating liner comprises a silicon oxide film, and an oxygen atom concentration of the insulating liner increases toward the device isolation film, and the insulating stopper comprises a silicon nitride film.

18. An integrated circuit device comprising:

a substrate having a back side surface;

a fin-type active region protruding from the substrate to define a portion of a trench region in the substrate on an opposite side of the back side surface;

at least one nanosheet on the fin-type active region, the at least one nanosheet apart from a fin top surface of the fin-type active region in a vertical direction;

a gate line surrounding the at least one nanosheet on the fin-type active region, the gate line extending in a second lateral direction, the second lateral direction intersecting a first lateral direction;

a source/drain region adjacent to the gate line on the fin-type active region, the source/drain region in contact with the at least one nanosheet;

a device isolation film covering at least a portion of a sidewall of the fin-type active region in the trench region, the device isolation film apart from the substrate in the vertical direction;

an etch stop structure comprising an insulating liner and an insulating stopper, the insulating liner filling at least a portion of the trench region between the substrate and the device isolation film, the insulating liner being in contact with each of the sidewall of the fin-type active region and the substrate, and the insulating stopper between the insulating liner and the device isolation film;

a via power rail apart from each of the fin-type active region, the source/drain region, and the gate line in the second lateral direction, the via power rail passing through the gate line in the vertical direction and passing through at least a portion of the etch stop structure; and a backside power rail passing from the back side surface of the substrate through the substrate in the vertical direction and contacting one end of the via power rail.

19. The integrated circuit device of claim 18, wherein at least a portion of the insulating liner comprises a crystalline silicon film, an amorphous silicon film, an undoped silicon film, a silicon oxide film, or a combination thereof, and the insulating stopper comprises a silicon nitride film.

20. The integrated circuit device of claim 18, wherein a contact surface between the via power rail and the backside power rail is between a bottom of the etch stop structure, which is closest to the back side surface of the substrate, and a top of the etch stop structure, which is farthest from the back side surface of the substrate.

* * * * *